United States Patent
Chen et al.

(10) Patent No.: US 9,202,658 B2
(45) Date of Patent: Dec. 1, 2015

(54) MULTI-AXIS MAGNETIC LENS FOR FOCUSING A PLURALITY OF CHARGED PARTICLE BEAMS

(71) Applicant: Hermes-Microvision, Inc., Hsinchu (TW)

(72) Inventors: Zhongwei Chen, San Jose, CA (US); Weiming Ren, San Jose, CA (US); Xuerang Hu, San Jose, CA (US); Xuedong Liu, San Jose, CA (US)

(73) Assignee: HERMES MICROVISION, INC., Hsinchu (TW)

( * ) Notice: Subject to any disclaimer, the term of this patent is extended or adjusted under 35 U.S.C. 154(b) by 0 days.

(21) Appl. No.: 14/572,052

(22) Filed: Dec. 16, 2014

(65) Prior Publication Data
US 2015/0179384 A1    Jun. 25, 2015

Related U.S. Application Data

(60) Provisional application No. 61/919,217, filed on Dec. 20, 2013.

(51) Int. Cl.
*H01J 1/50* (2006.01)
*H01J 3/20* (2006.01)

(52) U.S. Cl.
CPC .......................................... *H01J 3/20* (2013.01)

(58) Field of Classification Search
None
See application file for complete search history.

(56) References Cited

U.S. PATENT DOCUMENTS

| | | | | |
|---|---|---|---|---|
| 1,331,018 A | * | 2/1920 | Luthy | H01M 2/18 429/143 |
| 3,715,580 A | * | 2/1973 | Maekawa | B82Y 10/00 250/397 |
| 6,750,455 B2 | * | 6/2004 | Lo | B82Y 10/00 250/346 |
| 8,003,953 B2 | * | 8/2011 | Chen | H01J 37/141 250/396 ML |
| 8,294,095 B2 | * | 10/2012 | Chen | G01N 23/2251 250/310 |
| 8,445,862 B2 | * | 5/2013 | Chen | H01J 37/141 250/396 ML |

* cited by examiner

*Primary Examiner* — Andrew Smyth
(74) *Attorney, Agent, or Firm* — WPAT, PC; Justin King

(57) ABSTRACT

A multi-axis magnetic lens with stable performance in focusing a plurality of charged particle beams is provided. The multi-axis magnetic lens comprises a plurality of magnetic dub-lens modules. On the one hand, the multi-axis magnetic lens employs an annular permanent-magnet unit to provide a basic and stable magnetic flux to the plurality of magnetic sub-lens modules. One the other hand, the multi-axis magnetic lens uses a plurality of subsidiary coils to provide additional and adjustable magnetic flux to the plurality of magnetic sub-lens modules respectively. The invention also proposes a method to turn off or adjust the basic and stable magnetic flux for some applications. Hence, this invention will benefit the applications which need to execute in a long time period while keeping a high stabilization in performance.

28 Claims, 17 Drawing Sheets

(Invention)

100

100

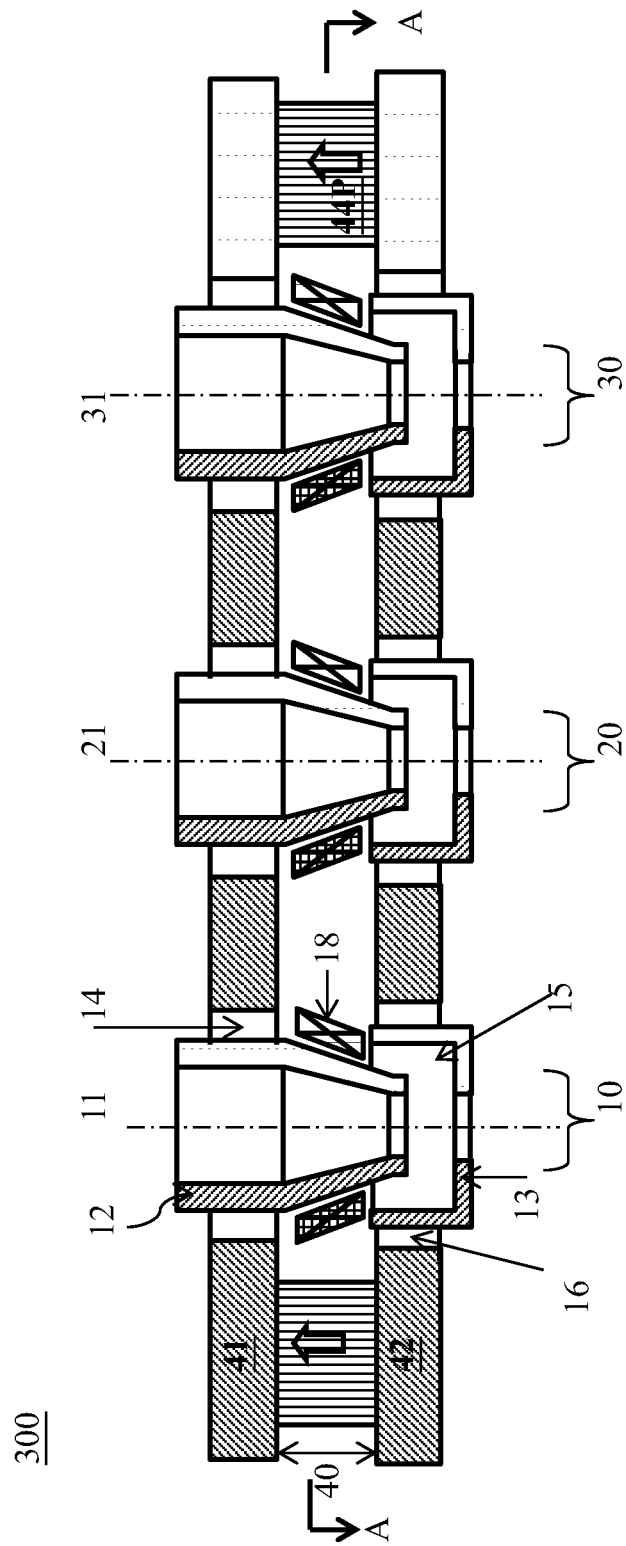
FIG. 3A (Invention)

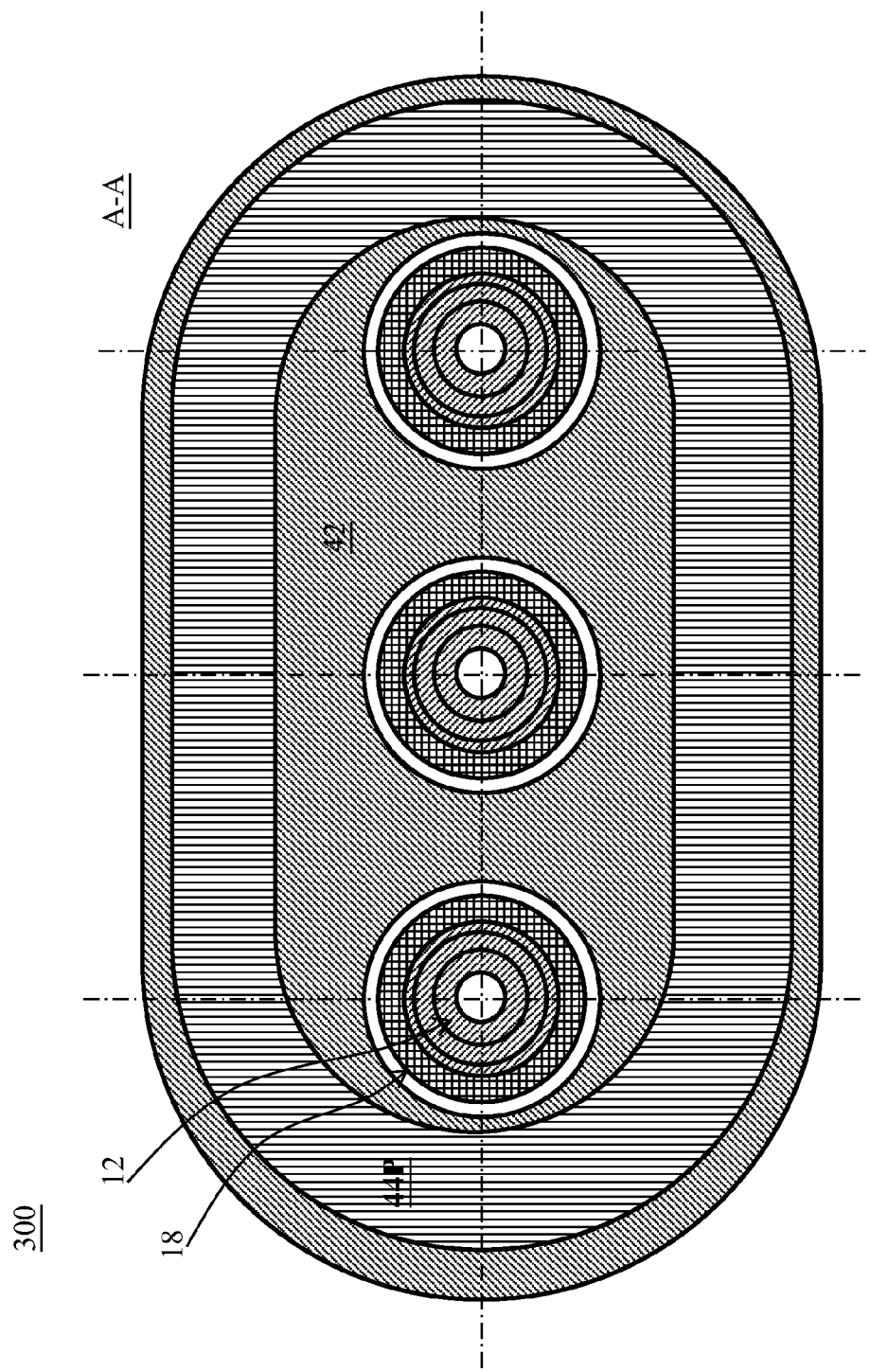
FIG. 3B (Invention)

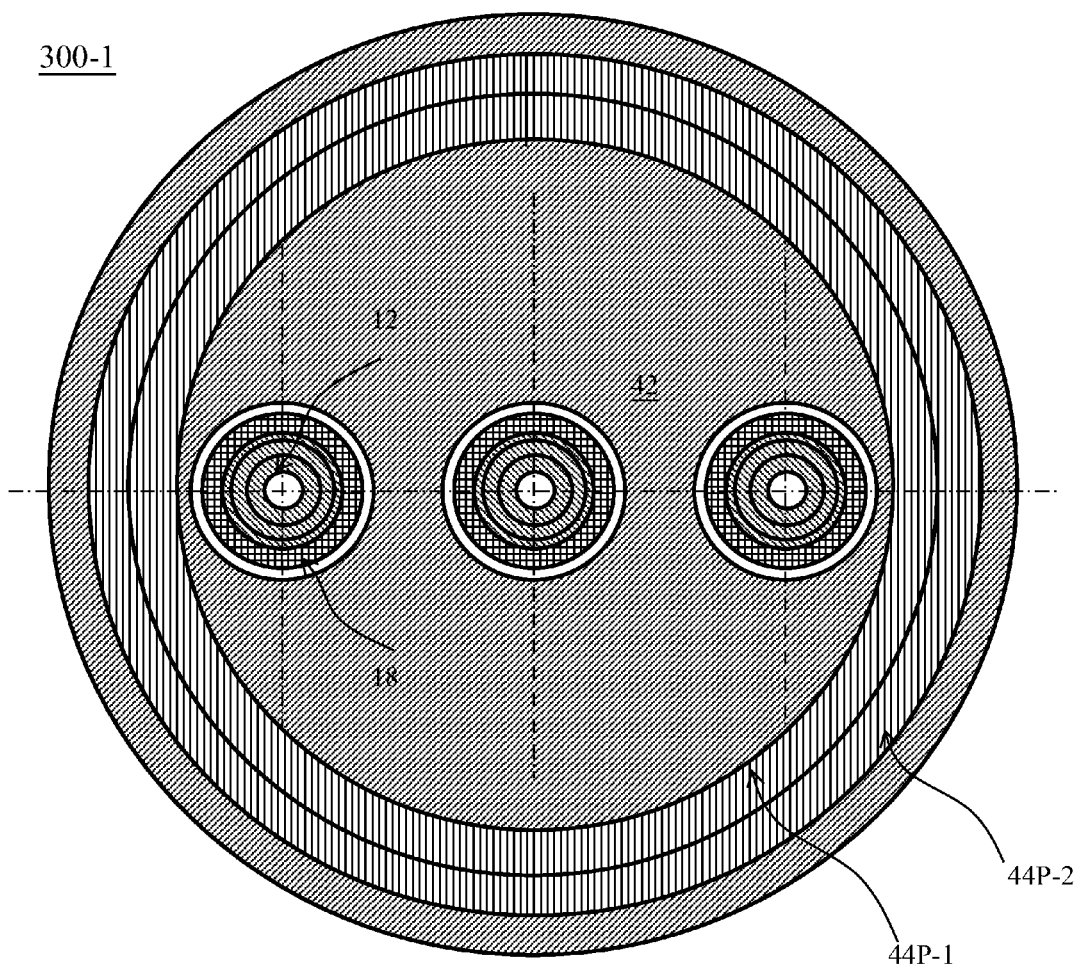
FIG. 4A (Invention)

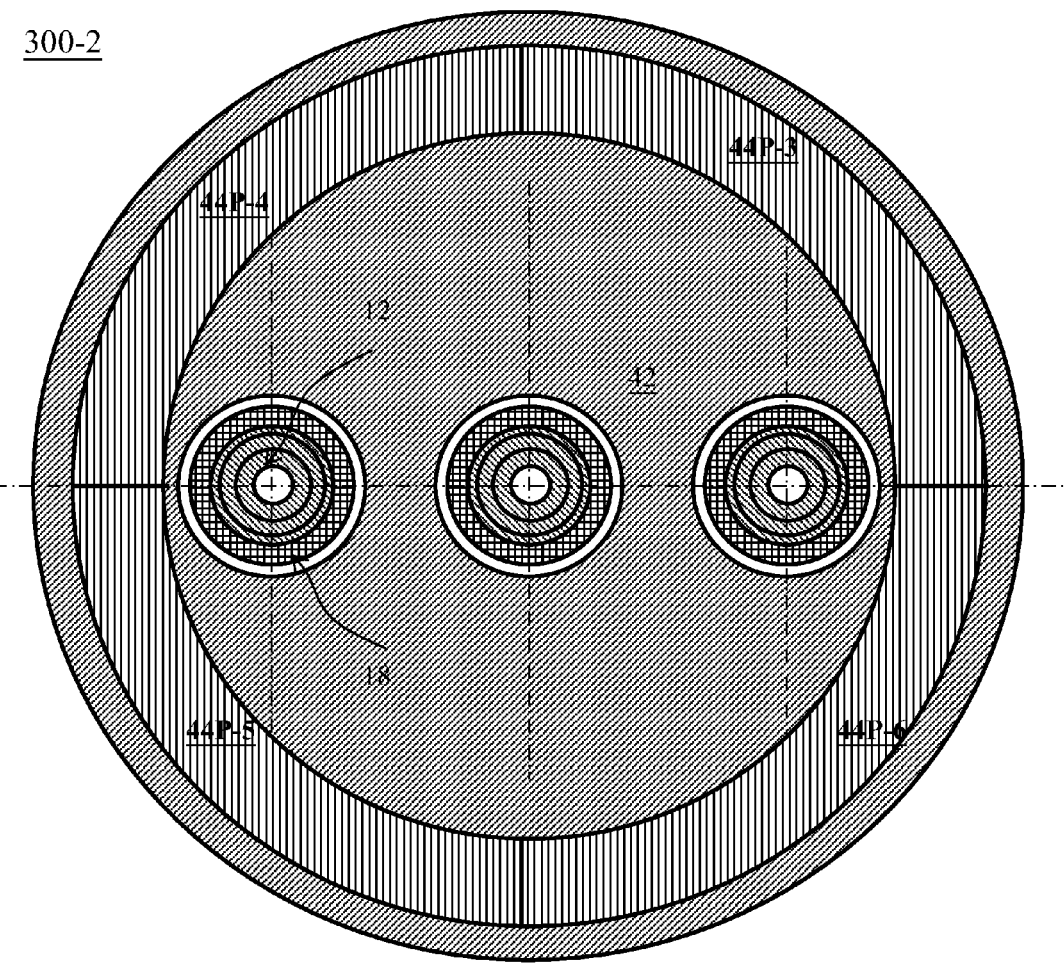
FIG. 4B (Invention)

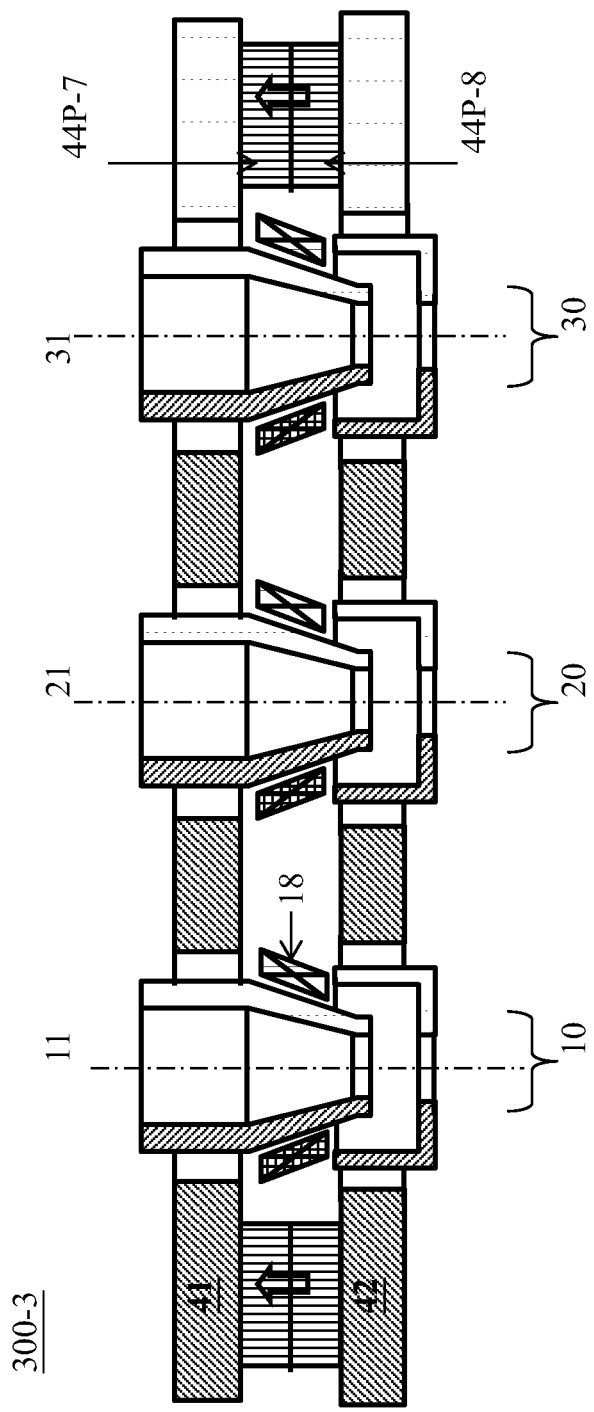
FIG. 4C (Invention)

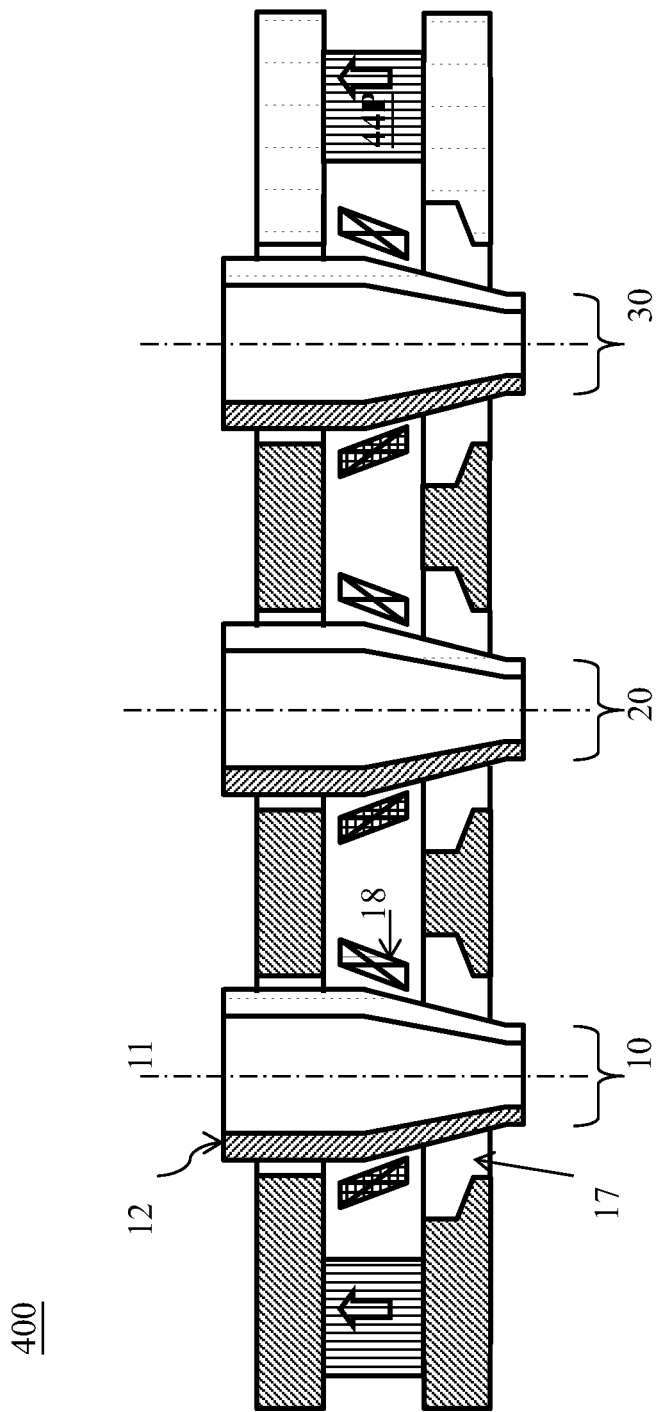
FIG. 5 (Invention)

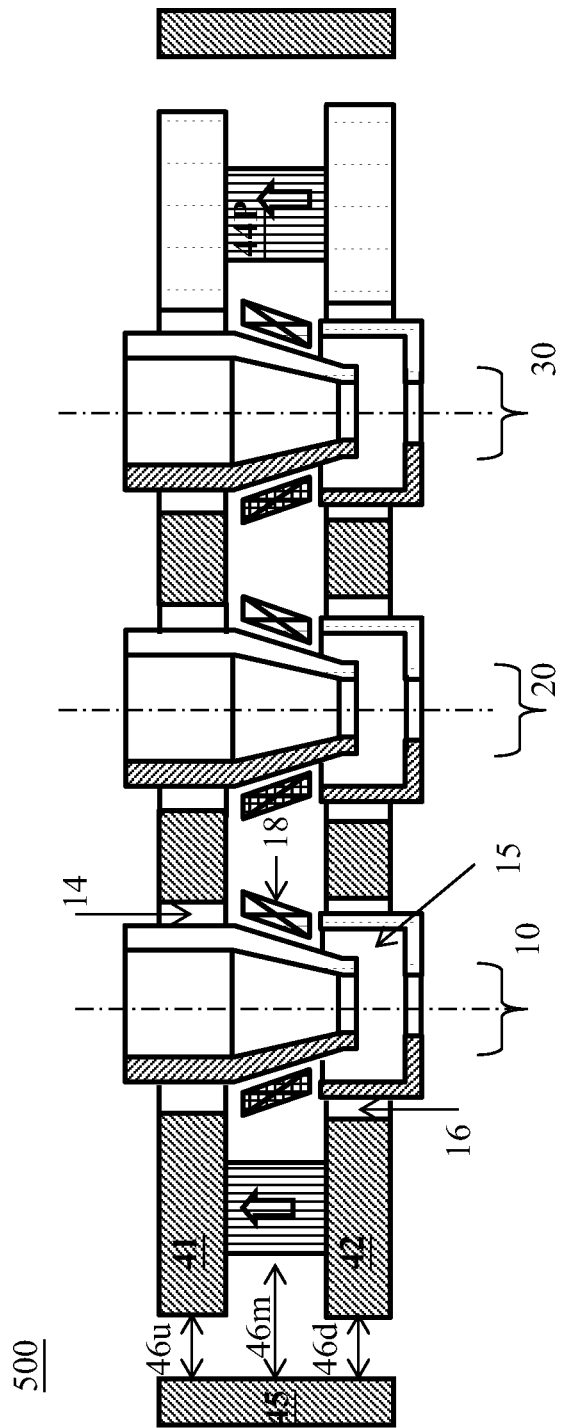
FIG. 6A (Invention)

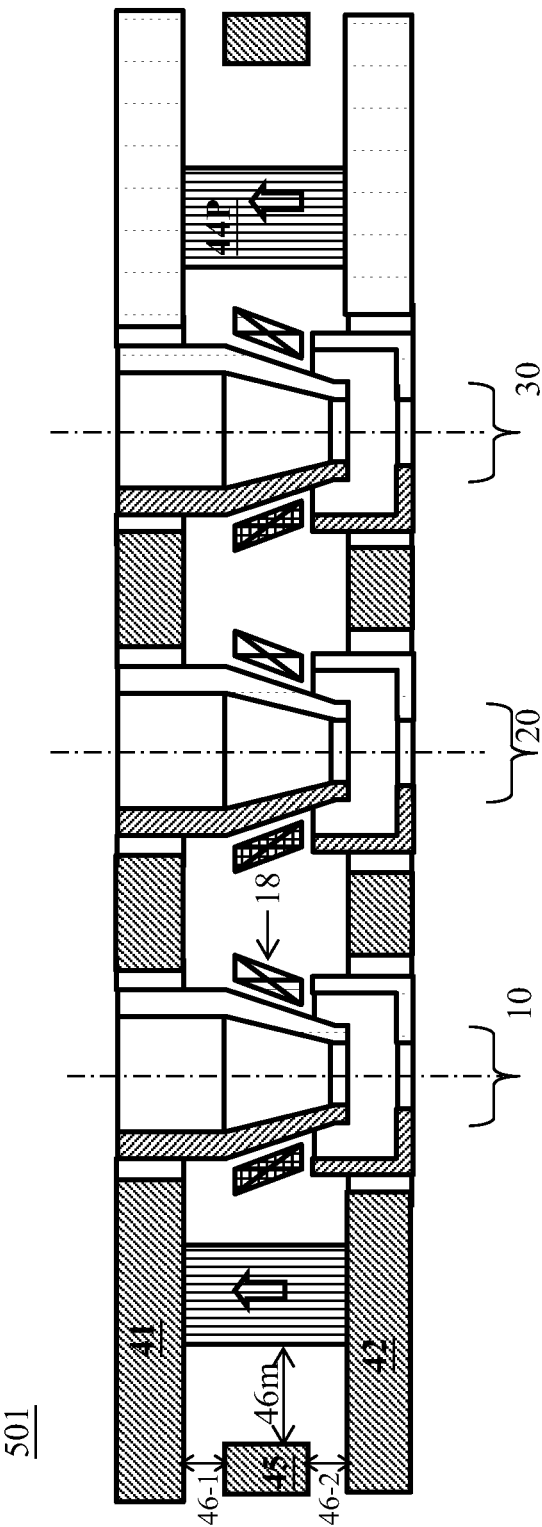
FIG. 6B (Invention)

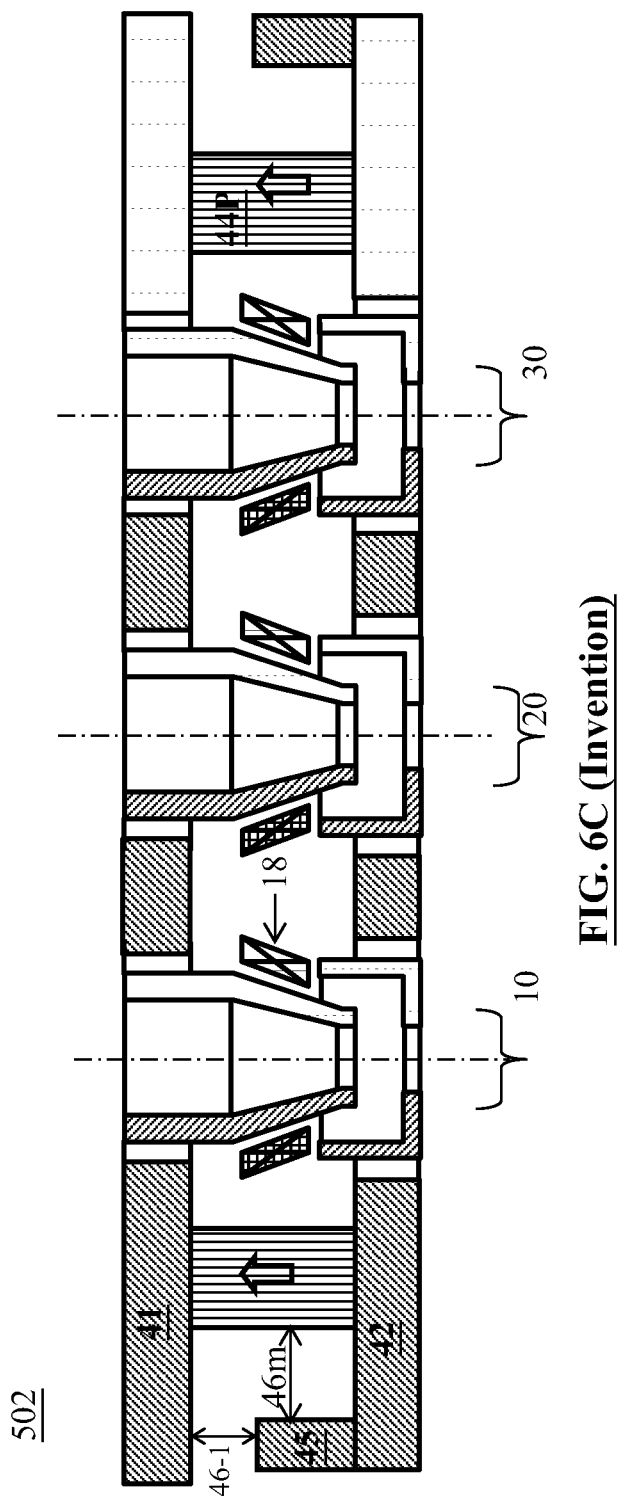

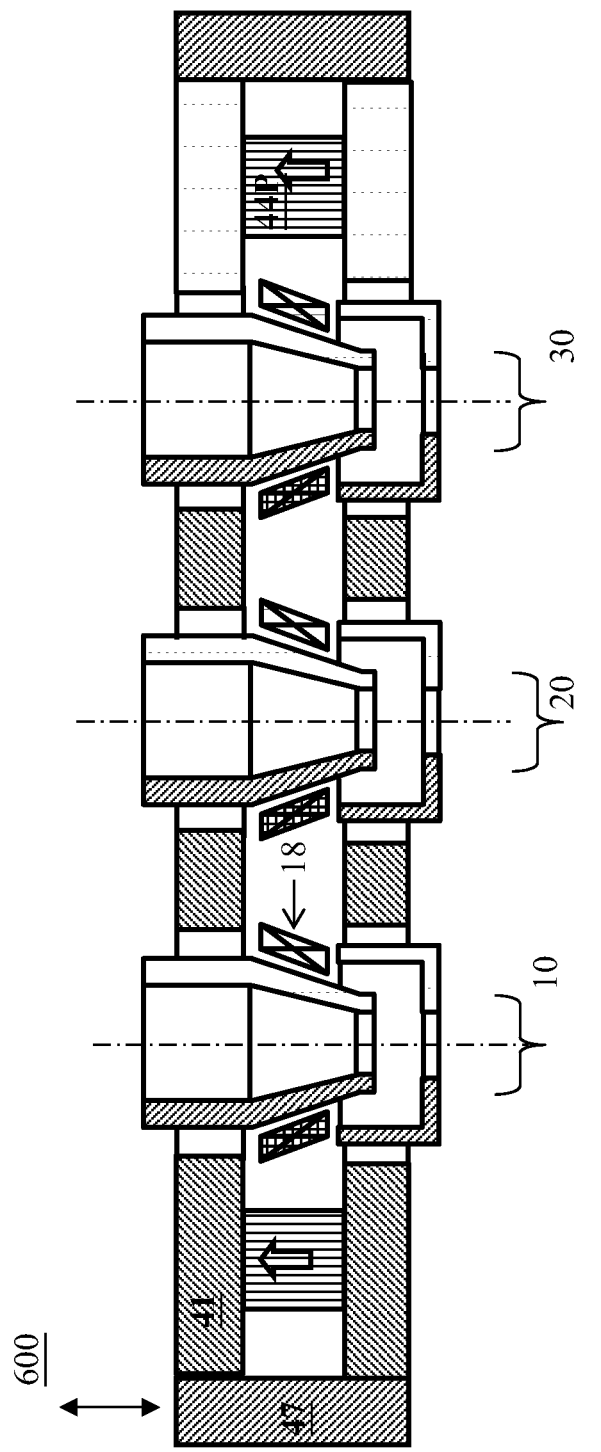
FIG. 7 (Invention)

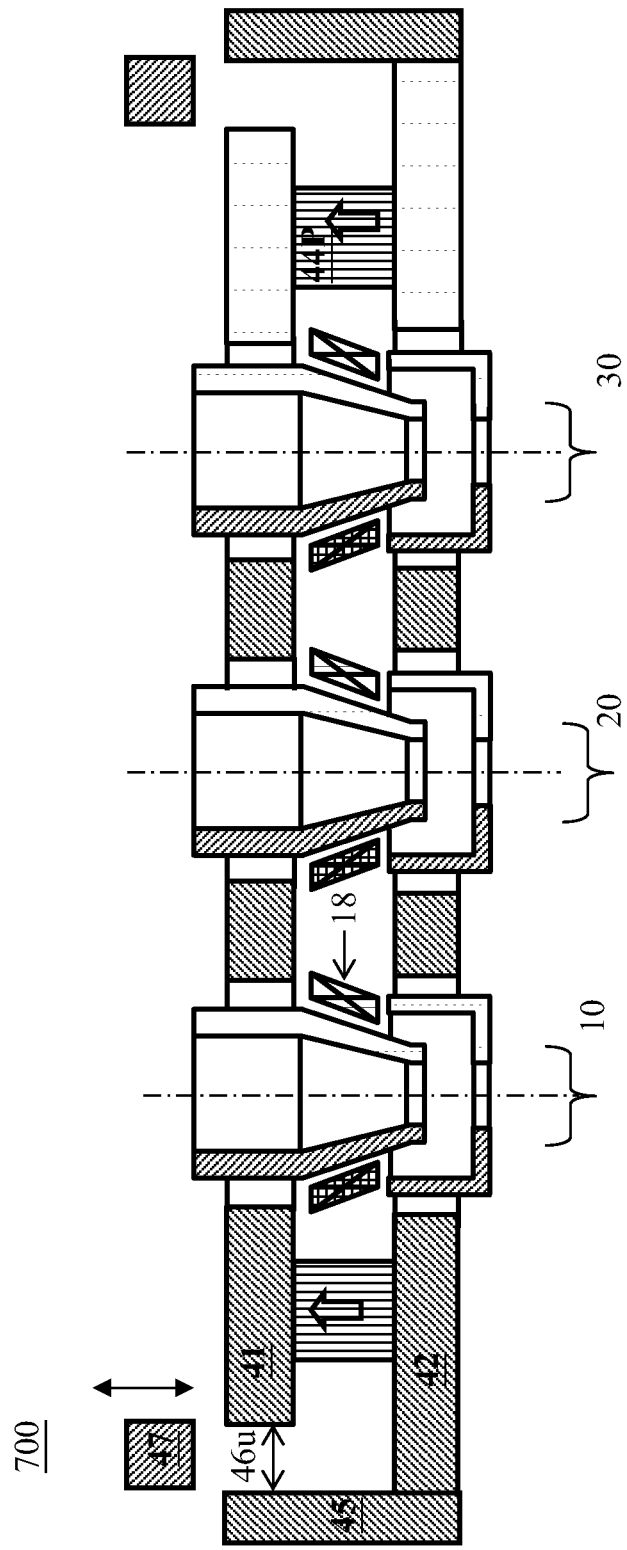
FIG. 8 (Invention)

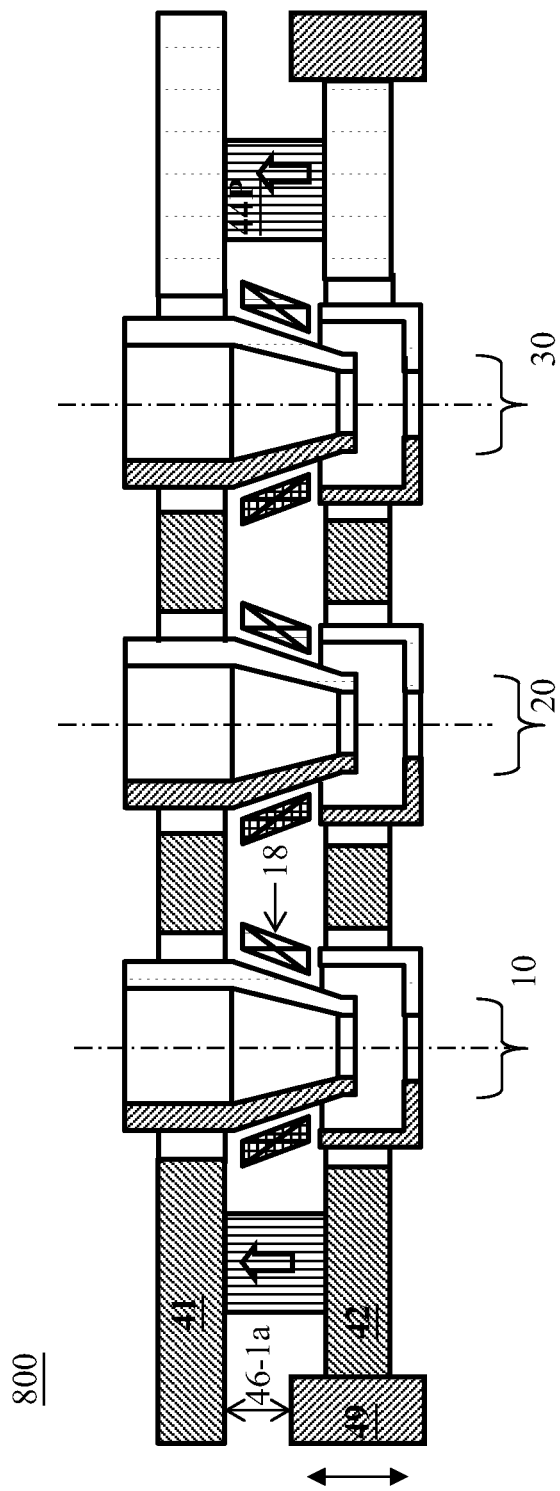
FIG. 9 (Invention)

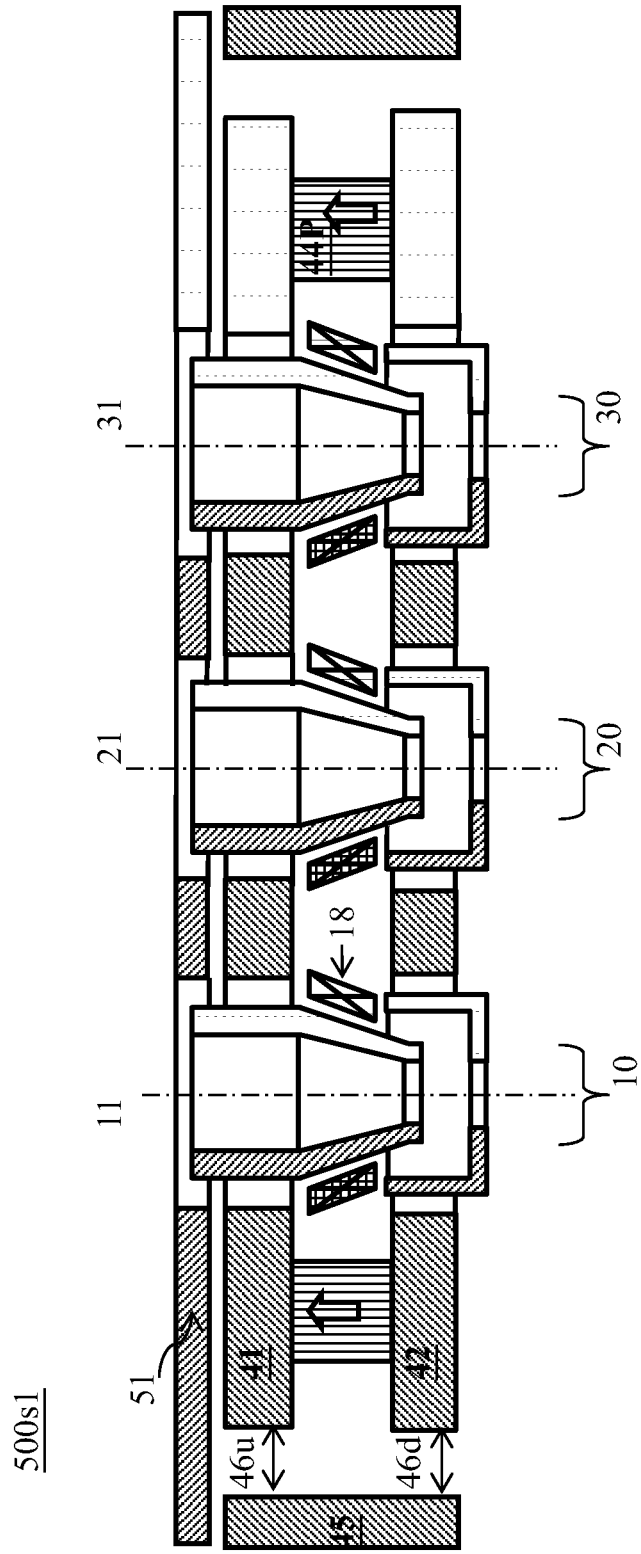
FIG. 10A (Invention)

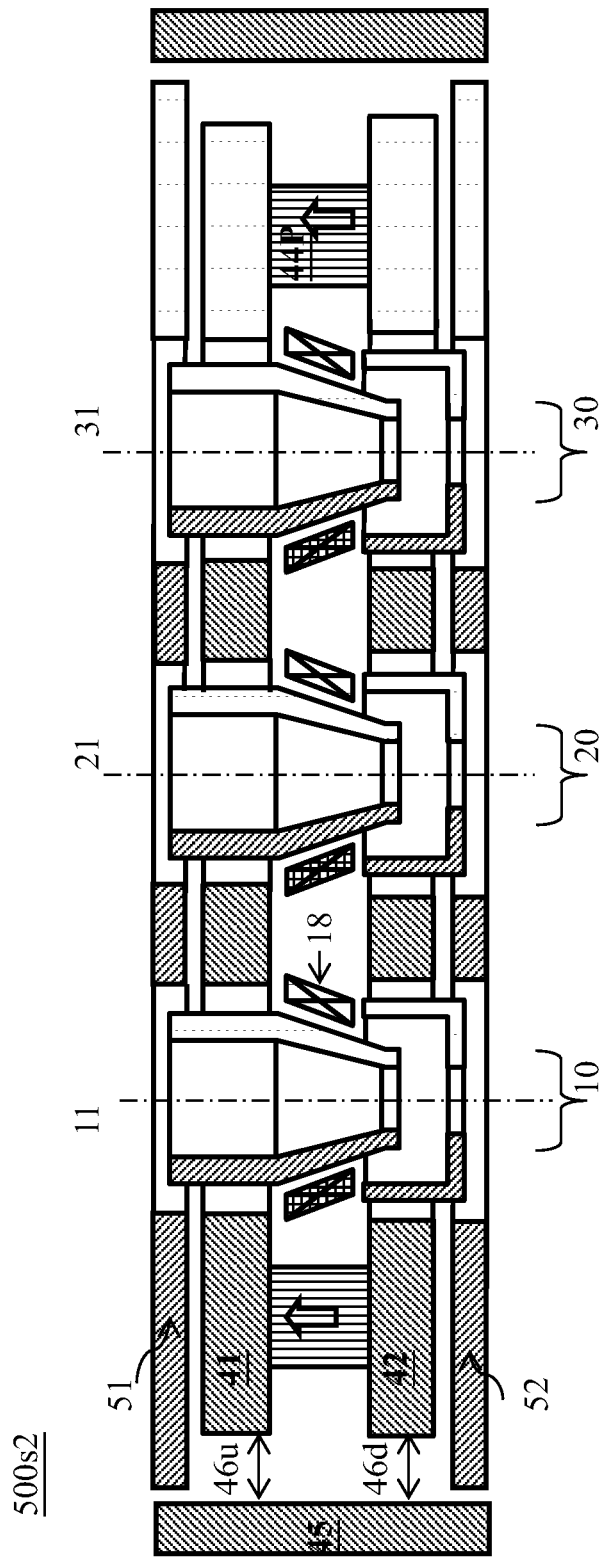
FIG. 10B (Invention)

MULTI-AXIS MAGNETIC LENS FOR FOCUSING A PLURALITY OF CHARGED PARTICLE BEAMS

CLAIM OF PRIORITY

This application claims the benefit of priority of U.S. provisional application No. 61/919,217 entitled to Chen et al. filed Dec. 20, 2013 and entitled "Multi-axis Magnetic Lens for Focusing a Plurality of Charged Particle Beams", the entire disclosures of which are incorporated herein by reference.

CROSS REFERENCE TO RELATED APPLICATIONS

This application is related to co-pending U.S. application Ser. No. 13/464,261 entitled to Ren et al. filed May 4, 2012 and entitled "Multi-axis Magnetic Lens for focusing a plurality of Charged Particle Beams", the entire disclosures of which are incorporated herein by reference.

BACKGROUND OF THE INVENTION

1. Field of the Invention

The present invention relates to a multi-axis magnetic lens and variants thereof used for focusing a plurality of charged particle beams individually and in parallel. More particularly, it relates to a multi-axis magnetic lens acting as an objective lens or a condenser lens, or a transfer lens in a multi-beam apparatus which uses a plurality of electron beams to in parallel expose patterns onto or inspect defects on a wafer or a mask in semiconductor manufacturing industry.

2. Description of the Prior Art

In semiconductor manufacturing industry, an electron beam has been used to expose patterns onto or inspect defects on a wafer or a mask since critical feature dimensions of patterns or defects have been beyond the competent ability of a photon beam. The reason is that an electron beam, due to its short wavelength, can offer superior spatial resolution compared to a photon beam. However, such a superior spatial resolution will be fundamentally deteriorated by electron interaction or called as Coulomb Effect as the electron beam current is increased to obtain a high throughput competent for mass production.

For mitigating the limitation on throughput, a promising solution is to use a plurality of electron beams each with a small current instead of using one electron beam with a large current. For this solution, the plurality of electron beams can be respectively focused by a plurality of single-axis magnetic/electrostatic lenses in a conventional manner or a plurality of magnetic sub-lenses of a multi-axis magnetic lens as Maekawa et al first proposed in the U.S. Pat. No. 3,715,580 as early as in 1971. Compared with the first way, the later way can even halve the interval between every two adjacent beams, thereby almost doubling the throughput.

FIGS. 1A and 1B respectively illustrate the configuration and the magnetic field distribution of the multi-axis magnetic lens 100 proposed in U.S. Pat. No. 3,715,580. The multi-axis magnetic lens 100 comprises one common exciting coil 44, one yoke 43, and two parallel magnetic conductor plates 41 and 42 with a plurality of through round holes in pairs. When an electric current is exerted into the coil 44, between a pair of coaxial through round holes, a magnetic axisymmetric field (round-lens field) will be generated along the coincident central axes thereof (such as 31 in FIG. 1B), and consequently one magnetic sub-lens such as 30 is formed therebetween.

The magnetic sub-lens module with respect to the magnetic sub-lens is therefore formed by the pair of coaxial through round holes, and called as the first-type magnetic sub-lens module hereafter for the sake of clarity. The optical axis of the magnetic sub-lens coincides with the central axis of the magnetic sub-lens module. The multi-axis magnetic lens 100 therefore comprises a plurality of first-type magnetic sub-lens modules and consequently can form a plurality of magnetic sub-lenses therein, such as sub-lenses 10, 20 and 30. The two magnetic conductor plates 41 and 42 function as pole pieces of the magnetic sub-lens modules. The magnetic sub-lenses 10, 20 and 30 respectively focus the charged particle beams 1, 2 and 3 propagating along the optical axes thereof.

In the foregoing multi-axis magnetic lens 100, the magnetic flux leakage between each pair of coaxial through round holes depends on the positions thereof on the magnetic conductor plates 41 and 42, geometrical shapes and magnetic permeability of the magnetic conductor plates 41 and 42, and the distribution of all the through round holes on the magnetic conductor plates 41 and 42. Hence, each magnetic sub-lens fundamentally generates not only a pure round-lens field but also a lot of non-axisymmetric transverse field components or called as high order harmonics, such as dipole field and quadrupole field. Only the round-lens field is necessary for focusing an electron beam, and the other components are undesired due to generating additional aberrations. To compensate the influence of each high order harmonic, at least one additional element generating the same type field is required and obviously the additional element will increase the volume and the complication of the multi-axis magnetic lens. In addition, even if all the through round holes are same in geometry, all the magnetic sub-lenses are different in the round-lens fields because of the differences in magnetic flux flowing through each magnetic sub-lens module. The closer the magnetic sub-lens module is to the geometrical center of the magnetic conductor plates 41 and 42, the weaker the round-lens field the magnetic sub-lens module produces. For example, the magnetic sub-lens 20 has a weaker round-lens field than the magnetic sub-lens 10 if the through round holes of both are equal in dimensions. The differences in round-lens fields of magnetic sub-lenses are not desired due to incurring beam defocusing for a specific imaging plane with respect to the plurality of electron beams, such as the same beams 1, 2 and 3 respectively passing through the sub-lens 10, 20 and 30 will not be focused onto a same plane.

Many scientists propose methods to fundamentally mitigate or even eliminate the two issues per se. Lo et al. in U.S. Pat. No. 6,750,455 uses a plurality of dummy holes to improve the local structure symmetry of each sub-lens. However this method makes the multi-axis magnetic lens system bulky. Chen et al. propose one method in U.S. Pat. Nos. 8,003,953, 8,294,095 and 8,445,862 and the cross reference, which can fundamentally mitigate or even eliminate the high order harmonics per se of each magnetic sub-lens and the differences among round-lens fields of all the magnetic sub-lenses.

The method uses three steps to mitigate or even eliminate the high order harmonics per se of each magnetic sub-lens, as shown by the multi-axis magnetic lens 200 in FIG. 2A. The first step, as the most profound step, is to insert a magnetic round ring (such as 12) inside one through hole of each first-type magnetic sub-lens module (such as 10) with a radial gap (such as 14). The radial gap can be vacuum or filled of non-magnetic or weakly-magnetic conductor material, which keeps a strong magnetic coupling between the magnetic round ring and the corresponding magnetic conductor plate and effectively weakens the non-axisymmetric distribution of magnetic scalar potential inside the magnetic round ring. Consequently, a magnetic field will be leaked out through the magnetic-circuit gap between the two magnetic round rings and distribute along the optical axis of the magnetic sub-lens. Out of the magnetic field, the axisymmetric component (round-lens field) is strong enough and the non-axisymmetric transverse field components are almost eliminated. With this way, the through holes are not necessary round in shape. The magnetic sub-lens module with respect to the magnetic sub-lens therefore is formed by the pair of through holes, the magnetic round rings therein and the radial gaps therebetween, and is called as the second-type magnetic sub-lens module hereafter for the sake of clarity. The magnetic round rings functionally are magnetic pole pieces and can flexibly shape the magnetic circuit gap for a specific application, such as an axial magnetic-circuit gap of a magnetic condenser sub-lens or a radial magnetic-circuit gap of a magnetic immersion objective sub-lens.

The second step is to extend one of the two magnetic round rings of each magnetic sub-lens module into the other so as to further eliminate the high order harmonics therebetween. If the extended magnetic round ring fully goes through the through hole in which the other magnetic round ring is inserted, in some cases the other magnetic round ring can even be removed for the sake of simplification in manufacturing. In the magnetic sub-lens 10 of the multi-axis magnetic lens 300 shown in FIG. 2B, the upper magnetic round ring 12 fully crosses over the upper and lower holes and the lower magnetic round ring 13 in FIG. 2A therefore can be removed. The third step, as one global magnetic-shielding means, is to place two magnetic-shielding plates 51 and 52 respectively above and below the two parallel magnetic conductor plates 41 and 42 so as to reduce the high order harmonics distributing in the areas above and below the plurality of second-type magnetic sub-lens modules. Furthermore, the differences of the radial gaps of all the magnetic sub-lens modules can be specifically designed to mitigate or even eliminate the round-lens field differences among all the magnetic sub-lenses.

Therefore, for focusing a charged particle beam, each magnetic sub-lens of the multi-axis magnetic lenses proposed by Chen et al. can provide performance as good as a conventional single-axis magnetic lens. As well known, the performance is desired to keep stable both in a short term and in a long term. The magnetic field of a magnetic sub-lens depends on the common coil excitation (product of coil turns T and coil current I) and the structure of the magnetic sub-lens module. The coil in a multi-axis magnetic lens is likely longer than the coil in a conventional single-axis magnetic lens, thereby generating more heat to deform the structure of the magnetic sub-lens module. The variation of the coil current varies the common coil excitation. These factors will make the magnetic field of each magnetic sub-lens unstable. Accordingly, a new multi-axis magnetic lens, which can provide magnetic sub-lens fields with high stabilization, is needed.

SUMMARY OF THE INVENTION

On the basis of the fundamental of U.S. Pat. Nos. 8,003, 953, 8,294,095 and 8,445,862 and the cross-reference, the object of this invention is to provide a multi-axis magnetic lens which has a highly stable performance in focusing a plurality of charged particle beams. The multi-axis magnetic lens employs an annular permanent-magnet unit providing a basic magnetic flux to a plurality of second-type magnetic sub-lens modules and a plurality of subsidiary coils each providing an additional magnetic flux to one of the plurality of magnetic sub-lens modules. Compared with a conventional multi-axis magnetic lens using a common coil, the unstablity of the magnetic flux provided by both the annular permanent-magnet unit and a subsidiary coil to a second-type magnetic sub-lens module can be negligible. Hence, this invention will benefit the applications which need to execute in a long time period while keeping a high stabilization in performance, such as the defect inspection of a full wafer in semiconductor yield management.

Accordingly, the invention therefore provides a first multi-axis magnetic lens, which comprises a pair of parallel magnetic conductor plates with a plurality of through holes in pairs therein, a plurality of magnetic round rings in pairs, a plurality of subsidiary coils, and an annular permanent-magnet unit. The pair of parallel magnetic conductor plates comprises an upper magnetic conductor plate and a lower magnetic conductor plate. The plurality of subsidiary coils and the annular permanent-magnet unit are between the upper and lower magnetic conductor plates. For each pair of through holes, an upper through hole in the upper magnetic conductor plate is aligned with a lower through hole in the lower magnetic conductor plate. For each pair of magnetic round rings, an upper magnetic round ring is inside the upper through hole of one pair of through holes and forms a first upper radial gap therebetween, a lower magnetic round ring is inside the lower through hole of the pair of through holes and forms a first lower radial gap therebetween. Moreover, the upper magnetic round ring is aligned with the lower magnetic round ring, and a lower end of the upper magnetic round ring extends downward into the lower magnetic round ring and forms a magnetic-circuit gap therebetween. The upper magnetic round ring of one pair of magnetic round rings is wound by one of the plurality of subsidiary coils.

In the first multi-axis magnetic lens, a plurality of magnetic sub-lens modules is therefore formed. Each of the plurality of magnetic sub-lens modules comprises one pair of through holes, one pair of magnetic round rings therein and one subsidiary coil winding the upper magnetic ring of the pair. For each sub-lens module, an optical axis thereof lies on a central axis of the upper magnetic round ring, the upper and lower magnetic round rings function as an upper pole-piece and a lower pole-piece respectively, and the subsidiary coil can be excited to provide a first magnetic flux leaking out through the magnetic-circuit gap and towards the optical axis. The annular permanent-magnetic unit surrounds the plurality of subsidiary coils and has an annular shape in a radial section. The annular permanent-magnet unit is magnetized in a direction perpendicular to the upper magnetic conductor plate to provide a second magnetic flux to the plurality of magnetic sub-lens modules. For each of the plurality of magnetic sub-lens modules, a portion of the second magnetic flux can flow in and leak out through the magnetic-circuit gap and towards the optical axis. Each of the plurality of magnetic sub-lens modules therefore is able to form a magnetic round-lens field with an excitation of the subsidiary coil thereof and/or the annular permanent-magnetic unit, and consequently the multi-axis magnetic lens can provide a plurality of magnetic sub-lenses.

In the first multi-axis magnetic lens, for each pair of magnetic round rings, magnetic permeabilities of the upper and lower magnetic round rings are preferred higher than that of the upper and lower magnetic conductor plates respectively, and the first upper and lower radial gaps can be vacuum or filled with non-magnetic or weakly-magnetic material. The annular permanent-magnet unit is preferred to contact the upper and lower magnetic conductor plates. The annular permanent-magnet unit can be formed by one full annular permanent magnet or several segmented permanent magnets. Outer radial dimensions of the upper and lower magnetic conductor plates are preferred equal to or larger than that of the annular permanent-magnet unit.

In a preferred embodiment of the present invention, the first multi-axis magnetic lens may further comprise a magnetic-shielding tube. The magnetic-shielding tube encloses the annular permanent-magnet unit with a third radial gap, and keeps a fourth gap from one or each of the upper and lower magnetic conductor plates so as to reduce upper and lower stray magnetic fields respectively above and below the plurality of magnetic sub-lens modules. The multi-axis magnetic lens may further comprise an upper magnetic-shielding plate above the upper magnetic conductor plate with a sixth axial gap and having a plurality of upper through circular openings, and a lower magnetic-shielding plate below the lower magnetic conductor plate with a seventh axial gap and having a plurality of lower through circular openings. The plurality of upper through circular openings and the plurality of lower through circular openings are respectively aligned with the plurality of magnetic sub-lens modules so as to reduce high order harmonics of magnetic fields of the plurality of magnetic sub-lenses.

In another preferred embodiment of the present invention, the first multi-axis magnetic lens may further comprise a magnetic short-circuit tube. The magnetic short-circuit tube is initially placed above the upper magnetic conductor plate or below the lower magnetic conductor plate so as not to influence the magnetic round-lens fields of the plurality of magnetic sub-lenses, and can be moved to connect peripheral portions of both the upper and lower magnetic conductor plates so as to form an enclosed magnetic bypass to the second magnetic flux and therefore turn off the multi-axis magnetic lens.

In another preferred embodiment of the present invention, the first multi-axis magnetic lens may further comprise a magnetic-shielding tube and a magnetic short-circuit tube. The magnetic-shielding tube encloses the annular permanent-magnet unit with a third radial gap and keeps a fourth radial gap from one of the upper and lower magnetic conductor plates. The magnetic short-circuit tube can be moved to fill in the fourth radial gap so as to form an enclosed magnetic bypass to the second magnetic flux and therefore turn off the multi-axis magnetic lens.

In another preferred embodiment of the present invention, the first multi-axis magnetic lens may further comprise a magnetic field-adjusting tube. The magnetic field-adjusting tube encloses the annular permanent-magnet unit with a third radial gap and keeps a fifth axial gap from one of the upper and lower magnetic conductor plates. The magnetic field-adjusting tube can be moved to change an axial size of the fifth axial gap so as to adjust the magnetic round-lens fields of the plurality of magnetic sub-lenses.

In another preferred embodiment of the present invention, the first multi-axis magnetic lens may further comprise an upper magnetic-shielding plate. The upper magnetic-shielding plate is located above the upper magnetic conductor plate with a sixth axial gap and has a plurality of upper through circular openings. The plurality of upper through circular openings is respectively aligned with the plurality of magnetic sub-lens modules so as to reduce high order harmonics of magnetic fields of the plurality of magnetic sub-lenses. The multi-axis magnetic lens may also further comprise a lower magnetic-shielding plate, which is located below the lower magnetic conductor plate with a seventh axial gap and having a plurality of lower through circular openings. The plurality of lower through circular openings is respectively aligned with the plurality of magnetic sub-lens modules so as to further reduce high order harmonics of magnetic fields of the plurality of magnetic sub-lenses.

The present invention also provides a second multi-axis magnetic lens, which comprises a pair of parallel magnetic conductor plates with a plurality of through holes in pairs therein, a plurality of magnetic round rings, a plurality of subsidiary coils and an annular permanent-magnet unit. The pair of parallel magnetic conductor plates comprises an upper magnetic conductor plate and a lower magnetic conductor plate. The plurality of subsidiary coils and the annular permanent-magnet unit are between the upper and lower plates. For each pair of through holes, an upper through hole in the upper magnetic conductor plate is aligned with a lower through hole in the lower magnetic conductor plate. Each of the plurality of magnetic round rings has an upper end inside the upper through hole of one pair of through holes and forming a first radial gap therebetween, and a lower end inside the lower through hole and forming a magnetic-circuit gap therebetween, and is wound by one of the plurality of subsidiary coils.

In the second multi-axis magnetic lens, a plurality of magnetic sub-lens modules is therefore formed. Each of said plurality of magnetic sub-lens modules comprises one pair of through holes, one magnetic round ring therein and one subsidiary coil winding the magnetic round ring. For each magnetic sub-lens module, an optical axis lies on a central axis of the magnetic round ring, the magnetic round ring functions as an upper pole-piece and a peripheral portion of the lower through hole in the lower magnetic conductor plate functions as a lower pole-piece, and the subsidiary coil can be excited to provide a first magnetic flux leaking out through the magnetic-circuit gap and towards the optical axis. The annular permanent-magnetic unit surrounds the plurality of subsidiary coils and has an annular shape in a radial section. The annular permanent-magnet unit is magnetized in a direction perpendicular to the upper magnetic conductor plate to provide a second magnetic flux to the plurality of magnetic sub-lens modules. For each of the plurality of magnetic sub-lens modules, a portion of the second magnetic flux can flow in and leak out through the magnetic-circuit gap and towards the optical axis. Each of the plurality of magnetic sub-lens modules therefore forms a magnetic round-lens field with an excitation of the subsidiary coil thereof and/or the annular permanent-magnetic unit, and consequently the multi-axis magnetic lens can provide a plurality of magnetic sub-lenses.

In the second multi-axis magnetic lens, magnetic permeability of each magnetic round ring is preferred higher than that of both the upper and lower magnetic conductor plates, and the first radial gaps can be vacuum or filled with non-magnetic or weakly-magnetic material. The annular permanent-magnet unit is preferred to contact the upper and lower magnetic conductor plates. Outer radial dimensions of the upper and lower magnetic conductor plates are preferred equal to or larger than that of the annular permanent-magnet unit.

In a preferred embodiment of the present invention, the second multi-axis magnetic lens may further comprise a magnetic-shielding tube which encloses the annular permanent-magnet unit with a third radial gap and keeps a fourth gap from one or each of the upper and lower plates so as to reduce a upper and lower stray magnetic fields respectively above and below the plurality of magnetic sub-lens modules. The second multi-axis magnetic lens may further comprise an upper magnetic-shielding plate located above said upper magnetic conductor plate with a sixth axial gap and having a plurality of upper through circular openings and a lower magnetic-shielding plate located below the lower magnetic conductor plate with a seventh axial gap and having a plurality of lower through circular openings. The plurality of upper through circular openings and the plurality of lower through circular openings are respectively aligned with the plurality of magnetic sub-lens modules, thereby reducing high order harmonics of magnetic fields of the plurality of magnetic sub-lenses.

The present invention provides a first method to configure a multi-axis magnetic lens, which comprises a step of forming a plurality of magnetic sub-lens modules and a step of placing an annular permanent-magnet unit. The plurality of magnetic sub-lens modules is configured by a pair of parallel magnetic conductor plates with a plurality of through holes in pairs therein, a plurality of magnetic round rings in pairs and a plurality of subsidiary coils. Each of the plurality of magnetic sub-lens modules comprises one pair of through holes, one pair of magnetic round rings and one subsidiary coil. For the pair of through holes, an upper through hole in an upper magnetic conductor plate of the pair of parallel magnetic conductor plates is aligned with a lower through hole in a lower magnetic conductor plate of the pair of parallel magnetic conductor plates. For the pair of magnetic round rings, an upper magnetic round ring inside the upper through hole with a first upper radial gap is aligned with a lower magnetic round ring inside the lower through hole with a first lower radial gap, a lower end of the upper magnetic round ring extends downward into the lower magnetic round ring and forms a magnetic-circuit gap therebetween, magnetic permeabilities of the upper and lower magnetic round rings are higher than that of the upper and lower magnetic conductor plates respectively, and the first upper and lower radial gaps can be vacuum or filled with non-magnetic or weakly-magnetic material. An optical axis of the magnetic sub-lens module lies on a central axis of the upper magnetic round ring. The subsidiary coil is between the upper and lower magnetic conductor plates, winds around the upper magnetic ring and can be excited to provide a first magnetic flux leaking out through the magnetic-circuit gap and towards the optical axis. The annular permanent-magnet unit is between the upper and lower magnetic conductor plates and surrounds the plurality of subsidiary coils. The annular permanent-magnet unit is magnetized in a direction perpendicular to the upper magnetic conductor plate to provide a second magnetic flux. For each magnetic sub-lens module, a portion of the second magnetic flux can flow in and leak out through the magnetic-circuit gap and towards the optical axis. Each of the plurality of magnetic sub-lens modules therefore is able to form a magnetic round-lens field with an excitation of the subsidiary coil and/or the annular permanent-magnetic unit.

In the first method, the annular permanent-magnet unit is preferred to contact the upper and lower magnetic conductor plates. The first method may further comprise a step of placing a magnetic-shielding tube enclosing the annular permanent-magnet unit to reduce upper and lower stray magnetic fields respectively above and below the plurality of magnetic sub-lens modules.

The present invention also provides a second method to configure a multi-axis magnetic lens, which comprises a step of forming a plurality of magnetic sub-lens modules and a step of placing an annular permanent-magnet unit. The plurality of magnetic sub-lens modules is configured by a pair of parallel magnetic conductor plates with a plurality of through holes in pairs therein, a plurality of magnetic round rings and a plurality of subsidiary coils. Each of the plurality of magnetic sub-lens modules comprises one pair of through holes, one magnetic round ring and one subsidiary coil. For the pair of through holes, an upper through hole and a lower through hole are respectively in an upper magnetic conductor plate and a lower magnetic conductor plate of the pair of parallel magnetic conductor plates and aligned with each other. The magnetic round ring has an upper end inside the upper through hole with a first radial gap and a lower end inside the lower through hole and forming a magnetic-circuit gap therebetween. The permeability of the magnetic ring is higher than that of the upper and lower magnetic conductor plates, and the first radial gap can be vacuum or filled with non-magnetic or weakly-magnetic material. An optical axis of the magnetic sub-lens module lies on a central axis of the magnetic ring. The subsidiary coil is between the upper and lower magnetic conductor plates, winds around the magnetic ring and can be excited to provide a first magnetic flux leaking out through the magnetic-circuit gap and towards the optical axis. The annular permanent-magnet unit is between the upper and lower plates and surrounds the plurality of subsidiary coils. The annular permanent-magnet unit is magnetized in a direction perpendicular to the upper magnetic conductor plate to provide a second magnetic flux. For each magnetic sub-lens module, a portion of the second magnetic flux can flow in and leak out through the magnetic-circuit gap and towards the optical axis. Each of the plurality of magnetic sub-lens modules therefore is able to form a magnetic round-lens field with an excitation of the subsidiary coil and/or the annular permanent-magnetic unit.

In the second method, the annular permanent-magnet unit is preferred to contact the upper and lower magnetic conductor plates. The second method may further comprise a step of placing a magnetic-shielding tube enclosing the annular permanent-magnet unit to reduce upper and lower stray magnetic fields respectively above and below the plurality of magnetic sub-lens modules.

The present invention also provides a third method for forming a multi-axis magnetic lens with stable performance. The third method comprises steps of providing a pair of parallel magnetic conductor plates with a plurality of through holes in pairs therein, providing a plurality of magnetic rings respectively inside the plurality of through holes, configuring a plurality of subsidiary coils respectively winding the plurality of magnetic rings, and providing an annular permanent-magnet unit surrounding the plurality of subsidiary coils. The plurality of subsidiary coils and the annular permanent-magnet unit are between an upper magnetic conductor plate and a lower magnetic conductor plate of the pair of parallel magnetic conductor plates. For each pair of through holes, an upper through hole and a lower through hole are respectively in the upper and the lower magnetic conductor plates and aligned with each other. Each magnetic ring has an upper end inside the upper through hole of one pair of through holes with a first radial gap and a lower end inside the lower through hole of the pair of through holes and forming a magnetic-circuit gap therebetween. The permeability of the magnetic ring is higher than that of the upper and lower magnetic conductor plates, and the first radial gap can be vacuum or filled with non-magnetic or weakly-magnetic material. The annular permanent-magnet unit is magnetized in a direction perpendicular to the upper magnetic conductor plate.

The present invention still also provides a fourth method for forming a multi-axis magnetic lens with stable performance. The fourth method comprises steps of providing a pair of parallel magnetic conductor plates with a plurality of through holes in pairs therein, providing a plurality of magnetic rings in pairs respectively inside the plurality of through holes in pairs, configuring a plurality of subsidiary coils, and providing an annular permanent-magnet. For each pair of through holes, an upper through hole in an upper magnetic conductor plate of the pair of parallel magnetic conductor plates is aligned with a lower through hole in a lower magnetic conductor plate of the pair of parallel magnetic conductor plates. For each pair of magnetic round rings, an upper magnetic ring inside the upper through hole of one pair of through holes with a first upper radial gap is aligned with a lower magnetic round ring inside the lower through hole of the pair of through holes with a first lower radial, a lower end of the upper magnetic ring extends downward into the lower magnetic ring and forms a magnetic-circuit gap therebetween, magnetic permeabilities of the upper and lower magnetic round rings are higher than that of the upper and lower magnetic conductor plates respectively, and the first upper and lower radial gaps can be vacuum or filled with non-magnetic or weakly-magnetic material. The plurality of subsidiary coils is between the upper and lower magnetic conductor plates, and respectively winds the plurality of upper magnetic rings. The annular permanent-magnet unit is also between the upper and lower magnetic conductor plates and surrounds the plurality of subsidiary coils. The annular permanent-magnet unit is magnetized in a direction perpendicular to the upper plate.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIGS. 3A and 3B are schematic illustrations of a new multi-axis magnetic lens in accordance with one embodiment of the present invention.

FIGS. 4A~4C are schematic illustrations of some variations of the permanent-magnet unit in accordance with the embodiment shown in FIGS. 3A and 3B.

FIG. 5 is a schematic illustration of a new multi-axis magnetic lens in accordance with another embodiment of the present invention.

FIG. 6A is a schematic illustration of a new multi-axis magnetic lens in accordance with another embodiment of the present invention.

FIGS. 6B and 6C are respectively one variation of the embodiment shown in FIG. 6A.

FIG. 7 is a schematic illustration of a new multi-axis magnetic lens in accordance with another embodiment of the present invention.

FIG. 8 is a schematic illustration of a new multi-axis magnetic lens in accordance with another embodiment of the present invention.

FIG. 9 is a schematic illustration of a new multi-axis magnetic lens in accordance with another embodiment of the present invention.

FIGS. 10A and 10B are schematic illustrations of a new multi-axis magnetic lens in accordance with another embodiment of the present invention.

DETAILED DESCRIPTION OF EXAMPLE EMBODIMENTS

Figure 1A:
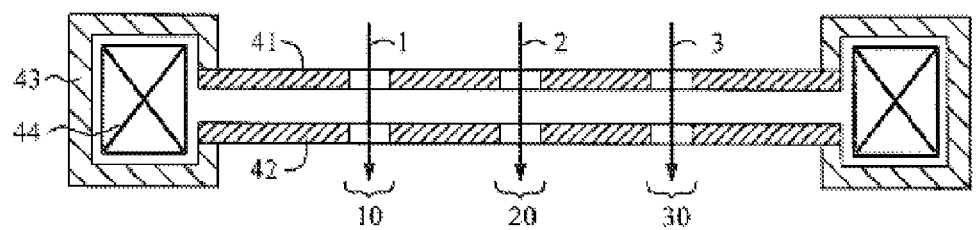
FIG. 1A is a schematic illustration of a configuration of a conventional multi-axis magnetic lens.
Figure 1B:
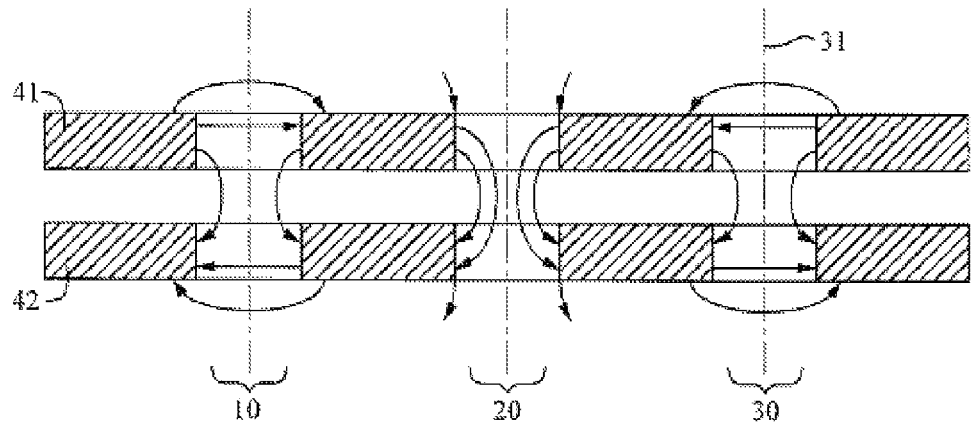
FIG. 1B is a schematic illustration of magnetic flux lines of the multi-axis magnetic lens shown in FIG. 1A.
Figure 2A:
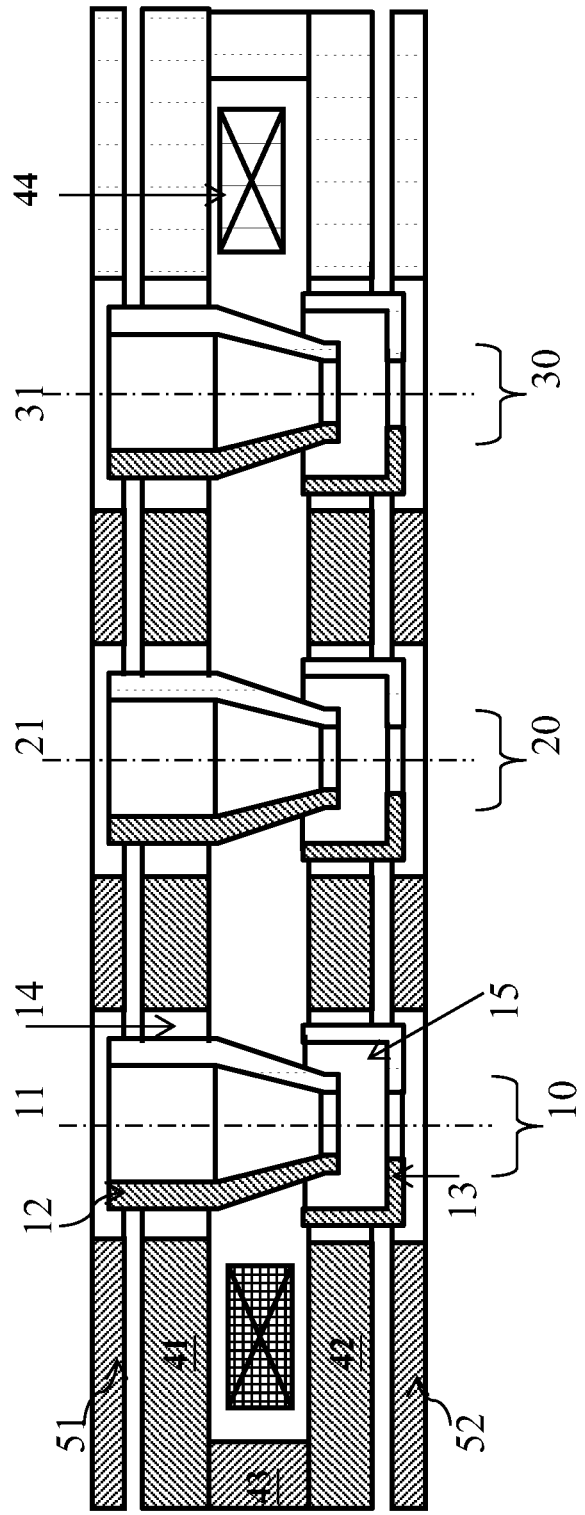
FIG. 2A is a schematic illustration of a modified multi-axis magnetic lens proposed in the prior art.
Figure 2B:
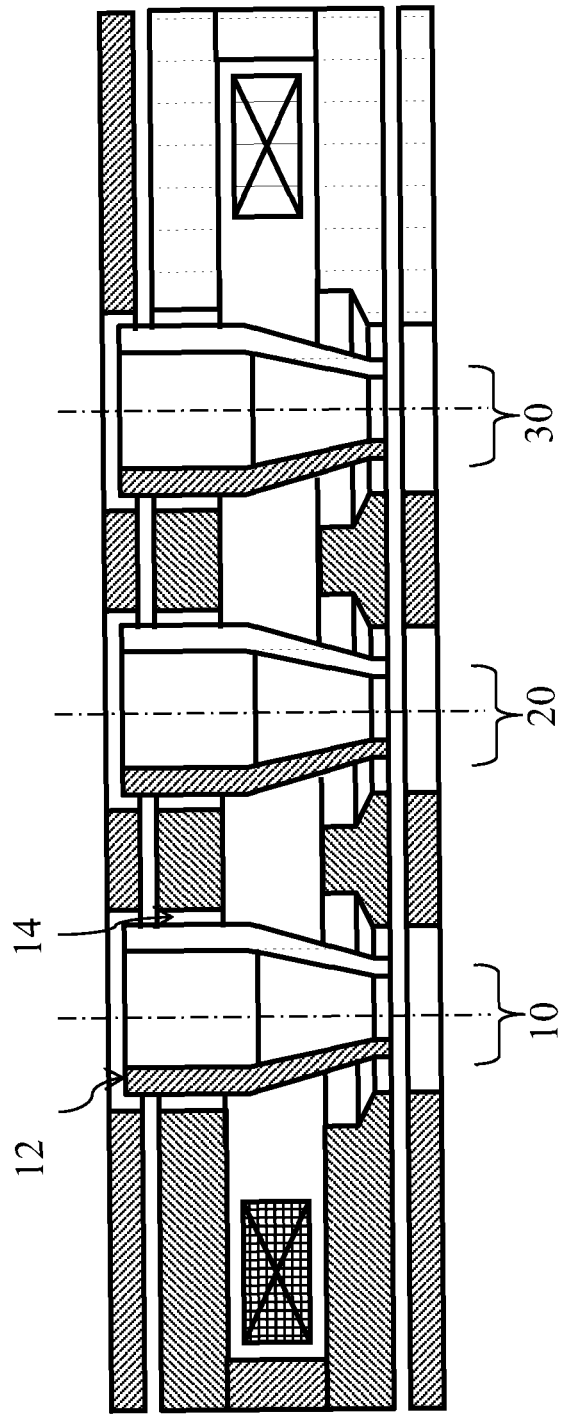
FIG. 2B is a schematic illustration of another modified multi-axis magnetic lens proposed in the cross-reference.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, the term "axial" means "in the optical axis direction of a lens or a sub-lens", while the term "radial" means "in a direction perpendicular to the optical axis of a lens or sub-lens".

In this invention, all terms relate to through holes or through openings mean openings or holes penetrated through one plate. Through holes always refer to holes in a magnetic conductor plate, and openings always refer to holes in a magnetic-shielding plate. A pair of though holes, two paired through holes or two through holes in pair mean two through holes which are respectively in two magnetic conductor plates and aligned with each other or simply called as being coaxial. For each second-type magnetic sub-lens module, upper and lower through holes refer to the through holes in the upper and lower magnetic conductor plates respectively, and upper and lower pole-pieces refer to the magnetic round rings originally belong to the upper and lower through holes respectively.

In this invention, the permeability of a "non-magnetic" or "non-magnetic conductor" material is 1 or substantially close to 1, the permeability of a "magnetic" or "magnetic conductor" material is much higher than 1, and the permeability of a "weakly-magnetic" or "weakly-magnetic conductor" material is higher than that of non-magnetic material but much smaller than that of the magnetic material immediately surrounding it.

In this invention, the term "annular" means "being an enclosed shape".

As described in DESCRIPTION OF THE PRIOR ART, a conventional multi-axis magnetic lens employs a common excitation coil to provide a magnetic flux to each first-type magnetic sub-lens module and therefore the magnetic field unstability of each magnetic sub-lens may be incurred by the variation of the current going through the common excitation coil and pole-piece thermal deformation due to a lot of heat generated by the common excitation coil. The magnetic field unstability will influence the focusing power of each magnetic sub-lens and therefore deteriorate imaging quality. Next, the present invention will provide a new multi-axis magnetic lens with higher magnetic field stabilization than the prior art.

Similar to the multi-axis magnetic lenses which Chen et al. proposed in U.S. Pat. Nos. 8,003,953, 8,294,095 and 8,445,862 and the cross-reference, the new multi-axis magnetic lens comprises a plurality of second-type magnetic sub-lens modules. Different from the foregoing prior art, the new multi-axis magnetic lens employs an annular permanent-magnet unit and a plurality of subsidiary coils to respectively provide a large and stable magnetic flux and a small and adjustable magnetic flux to each of the plurality of second-type magnetic sub-lens modules. Each subsidiary coil winds around and is not necessary to contact the upper pole-piece inside one of the plurality of second-type magnetic sub-lens modules. One magnetic sub-lens module in the new multi-axis magnetic lens therefore comprises one second-type magnetic sub-lens module and one subsidiary coil. For the sake of clarity, it is called as third-type magnetic sub-lens module. The annular permanent-magnet unit is sandwiched by the two magnetic conductor plates and surrounds the plurality of third-type magnetic sub-lens modules.

Compared with the common excitation coil in a conventional multi-axis magnetic lens, each subsidiary coil has much fewer coil turns and the plurality of subsidiary coils has a much shorter total coil length. For example, one magnetic sub-lens needs 2000 AT excitation. In the conventional multi-axis magnetic lens whose common excitation coil has 1000 turns (i.e. $T_1=1000$ turns), the coil current $I_1$ is therefore 2 A. The magnetic field unstability, coming from the coil current variation, depends on $T_1$. In the new multi-axis magnetic lens, the permanent-magnet unit provides 1600 AT and each subsidiary coil has 200 turns (i.e. $T_2=200$ turns) and therefore can provide the left 400 AT when the coil current $I_2$ is equal to $I_1$. For the latter, the permanent-magnet unit is remarkably stable and generates almost no heat. The coil excitation variation due to the coil current variation only depends on $T_2$ which is much fewer than $T_1$. The circumference of a turn in the common excitation coil is much longer than that in each subsidiary coil. Consequently, the coil excitation variation and the pole-piece thermal deformation can be dramatically reduced. For each magnetic sub-lens, the magnetic field stability therefore is dramatically increased. Next, some embodiments of the new multi-axis magnetic lens are provided and described.

One basic embodiment is first shown in FIGS. 3A and 3B. In the multi-axis magnetic lens 300, the two magnetic conductor plates 41 and 42 with a plurality of paired through holes are in parallel and sandwich the annular permanent-magnet unit 44P and a plurality of subsidiary coils (such as 18), and therefore a plurality of third-type magnetic sub-lens modules or sub-lenses (here only three sub-lenses 10, 20 and 30 are shown for the sake of simplification) is formed. Taking the left sub-lens 10 as an example, the upper and the lower magnetic round rings 12 and 13 are respectively inside one of the paired through holes and form a radial gap therebetween such as 14 and 16. Furthermore, the upper magnetic round ring 12 extends downward into the lower magnetic round ring 13 and forms a magnetic-circuit gap (non-magnetic gap) 15 therebetween. The two radial gaps 14 and 16 can be vacuum or filled of non-magnetic or weakly-magnetic material. The subsidiary coil 18 winds the upper magnetic round ring 12 and is between the two magnetic conductor plates 41 and 42. The annular permanent-magnet unit 44P is axially and upward magnetized as shown by the upward arrow and has an annular shape in a radial section. The annular permanent-magnet unit 44P is preferred formed by one full annular permanent magnet, but can be configured with several segmented permanent magnets. It is better to make the annular permanent-magnet unit 44P contact with the two magnetic conductor plates 41 and 42. The axial gap 40 formed by the peripheral portions of the magnetic conductor plates 41 and 42 can be vacuum or filled of non-magnetic or weakly-magnetic material. A part of the magnetic flux provided by the permanent-magnet unit 44P may leak out through the axial gap 40 and then go into the areas respectively above and below the multi-axis magnetic lens 300. The part of the magnetic flux or called as the externally-leaked magnetic flux will generate an upper and a lower stray magnetic fields respectively above and below the plurality of magnetic sub-lens modules. For the magnetic field of each magnetic sub-lens, the upper and lower stray magnetic fields enhance its non-axisymmetry and add a long tail to each side of its axial distribution. To reduce the upper and lower stray magnetic fields as much as possible, the outer radial dimensions of the magnetic conductor plates 41 and 42 are preferred larger than that of the annular permanent-magnet unit 44P.

The annular permanent-magnet unit 44P in the multi-axis magnetic lens 300 shown in FIGS. 3A and 3B, is formed by one full permanent magnet and has a rounded rectangular shape in the inner and outer outlines thereof in a radial section. Some variations of the permanent-magnet unit 44P are exemplified. In FIGS. 4A and 4B, the annular permanent-magnet unit 44P has a circular shape in the inner and outer outlines thereof in a radial section, and respectively comprises two permanent magnets 44P-1 and 44P-2 segmented radially and four permanent magnets 44P-3, 44P-4, 44P-5 and 44P-6 segmented azimuthally. In FIG. 4C, the annular permanent-magnet unit 44P comprises two permanent magnets 44P-7 and 44P-8 segmented axially.

Next, some derived embodiments of the new multi-axis magnetic lens are provided in terms of the basic embodiment shown in FIG. 3A. FIG. 5 shows one multi-axis magnetic lens 400 with a simple mechanical structure. Inside each of the plurality of third-type magnetic sub-lens modules, for example the left one, the lower magnetic round ring 13 in FIG. 3A is removed, and the upper magnetic round ring 12 is extended to fully go through the lower through hole and forms a radial magnetic-circuit gap (radial non-magnetic gap) 17 therebetween. Consequently, a magnetic field is leaked out through the magnetic-circuit gap 17 and distributes along the optical axis 11. Removing the lower magnetic round rings obviously simplifies the mechanical structure, and thereby being advantageous for manufacturing. The multi-axis magnetic lens 400 is very suitable as an immersion magnetic objective lens with a short working distance.

FIG. 6A shows one multi-axis magnetic lens 500 with weak upper and lower stray magnetic fields. The magnetic-shielding tube 45 encloses the annular permanent-magnet unit 44P and two magnetic conductor plates 41 and 42 and forms radial gaps 46m, 46u and 46d therebetween respectively. The three radial gaps 46m, 46u, and 46d can be vacuum or filled of non-magnetic or weakly-magnetic material. The radial dimensions of the radial gaps 46u and 46d are larger than that of the radial gaps (such as 16 and 14) inside the through holes of each magnetic sub-lens module so as not to obviously reduce the magnetic flux leaking out through the magnetic-circuit gap (such as 15) thereof, and smaller than the axial gap 40 so as to effectively reduce and guide the externally-leaked magnetic flux not going into the areas respectively above and below the multi-axis magnetic lens 500. In this way, the upper and lower stray magnetic fields therefore can be dramatically reduced.

The foregoing method can be realized in many ways. FIGS. 6B and 6C respectively show one variation. In the multi-axis magnetic lens 501 shown in FIG. 6B, the magnetic-shielding tube 45 encloses the annular permanent-magnet unit 44P with the radial gap 46m and is sandwiched by the two magnetic conductor plates 41 and 42 with two axial gaps 46-1 and 46-2. The axial dimensions of the axial gaps 46-1 and 46-2 are larger than that of the radial gaps inside the through holes of each magnetic sub-lens module so as not to obviously reduce the magnetic flux leaking out through the magnetic-circuit gap thereof, and small enough so as to effectively reduce and guide the externally-leaked magnetic flux not going into the areas respectively above and below the multi-axis magnetic lens 501.

To simplify the mechanical structure, one of the two gaps respectively formed by the magnetic-shielding tube 45 and one of the two magnetic conductor plates 41 and 42 can be removed. In the multi-axis magnetic lens 502 shown in FIG. 6C, the magnetic-shielding tube 45 encloses the annular permanent-magnet unit 44P with the radial gap 46m, stands on the lower magnetic conductor plate 42, extends towards the upper magnetic conductor plate 41 and forms one axial gap 46-1 therebetween. The axial dimension of the axial gaps 46-1 is larger than that of the radial gaps inside the through holes of each magnetic sub-lens module so as not to obviously reduce the magnetic flux leaking out through the magnetic-circuit gap thereof, and small enough so as to effectively reduce and guide the externally-leaked magnetic flux not going into the areas respectively above and below the multi-axis magnetic lens 502.

For a good reason a multi-axis magnetic lens may be required to be turned off for a certain period of time, such as aligning another lens of one apparatus in which the multi-axis magnetic lens is employed. FIG. 7 shows one multi-axis magnetic lens 600 with a turn-off function. The magnetic short-circuit tube 47 can be moved to connect the peripheral portions of both the magnetic conductor plates 41 and 42 so as to form an enclosed magnetic bypass with respect to the annular permanent-magnet unit 44P. In this case, instead of going to the plurality of magnetic sub-lens modules, almost all of the magnetic flux will go through the enclosed magnetic bypass. Furthermore, if there is no excitation current going through the subsidiary coil of each magnetic sub-lens module, the multi-axis magnetic lens 600 is completely turned off. This magnetic short-circuit method can also be used to one multi-axis magnetic lens with weak upper and lower stray magnetic fields mentioned above. In FIG. 8, the multi-axis magnetic lens 700 can be disabled by moving the magnetic short-circuit tube 47 into the radial gap 46u formed by the magnetic-shielding tube 45 and the upper magnetic conductor plate 41.

Inside each magnetic sub-lens in the foregoing embodiments, the magnetic flux coming from the permanent-magnet unit 44P is either fixed (when the magnetic bypass is open or there is no magnetic bypass) or turned off (when the magnetic bypass is enclosed). Therefore the magnetic field of each magnetic sub-lens is only continuously adjustable within a small range determined by the subsidiary coil excitation. For some applications such as focusing an electron beam whose energy may change within a large range, the magnetic field of each magnetic sub-lens needs to be adjustable over a large range. The foregoing magnetic bypass can be modified to meet this requirement. FIG. 9 shows one multi-axis magnetic lens 800 with a large adjusting range of magnetic field. The magnetic field-adjusting tube 49 surrounds the lower magnetic conductor plate 42 with no radial gap and the permanent-magnet unit 44P with a radial gap, is under the upper magnetic conductor plate 41 and forms an axial gap 46-1a therebetween. The axial gap 46-1a is a vacuum space. Hence one magnetic bypass with the axial non-magnetic gap 46-1a is formed for the magnetic flux coming from the permanent-magnet unit 44P. As the magnetic field-adjusting tube 49 is moved upwards to approach the upper magnetic conductor plate 41, the axial gap 46-1a becomes short, so the more of the magnetic flux therefore goes through the magnetic bypass and consequently the magnetic field of each magnetic sub-lens is reduced. If the magnetic field-adjusting tube 49 contacts the upper magnetic conductor plate 41, the magnetic bypass is enclosed. In this case almost all of the magnetic flux goes through the enclosed magnetic bypass, and therefore the magnetic field of each magnetic sub-lens is almost reduced to zero. As a result, the magnetic field of each magnetic sub-lens can be adjusted in a large range by changing the axial position of the movable magnetic field-adjusting tube 49.

The third step, that Chen et al. use to reduce the high order harmonics of the magnetic field of each magnetic sub-lens outside the module thereof as described in DESCRIPTION OF THE PRIOR ART, is also useful for the new multi-axis magnetic lens and can be used in combination with the foregoing methods. FIG. 10A show a way to incorporate one magnetic-shielding plate 51 into the multi-axis magnetic lens 500 shown in FIG. 6A. The magnetic-shielding plate 51 is located above the upper magnetic conductor plate 41 with an axial gap and large enough to cover the radial gap 46u. FIG. 10B show a way to incorporate two magnetic-shielding plates 51 and 52 in the multi-axis magnetic lens 500 shown in FIG. 6A. The two magnetic-shielding plates 51 and 52 are respectively located above and below the upper and lower magnetic conductor plates 41 and 42 with an axial gap therebetween, and enclosed by the magnetic-shielding tube 45 with a radial gap therebetween. The radial sizes of the two radial gaps are smaller than the radial sizes of the two radial gaps 46u and 46d. The foregoing radial and axial gaps can be vacuum or filled of non-magnetic or weakly-magnetic material.

In the foregoing embodiments, for each magnetic sub-lens module with one pair of magnetic rings, the upper magnetic ring extends downward into the lower magnetic ring to form the magnetic-circuit gap therebetween and therefore the subsidiary coil winds the upper magnetic ring. Alternately, the lower magnetic ring can also extend upward into the upper magnetic ring to form a magnetic-circuit gap therebetween for some applications, and accordingly the subsidiary coil can wind the lower magnetic ring. For each magnetic sub-lens module with a single magnetic ring, the magnetic ring and the lower through hole form the magnetic-circuit gap therebetween. Alternately, the magnetic ring can also form a magnetic-circuit gap with the upper through hole.

In summary, this invention provides a new multi-axis magnetic lens with a highly stabile performance in focusing a plurality of charged particle beams. The multi-axis magnetic lens comprises one annular permanent-magnet unit and a plurality of third-type magnetic sub-lens modules each having a subsidiary coil. Each sub-lens module is provided a large and stable magnetic flux by the annular permanent-magnet unit and a small and adjustable magnetic flux by its subsidiary coil, and therefore can form a very stable magnetic sub-lens. The annular permanent-magnet unit is remarkably stable and generates almost no heat. Compared with a common excitation coil in a conventional multi-axis magnetic lens, each subsidiary coil generates much lower coil excitation variation and the subsidiary coils totally generate less heat. Hence, this invention will benefit the applications which need to execute in a long time period while keeping a high stabilization in performance, such as the defect inspection of a full wafer in semiconductor yield management.

Although the present invention has been explained in relation to its preferred embodiment, it is to be understood that other modifications and variation can be made without departing the spirit and scope of the invention as hereafter claimed.

What is claimed is:

1. A multi-axis magnetic lens, comprising:
a pair of parallel magnetic conductor plates with a plurality of through holes in pairs therein, wherein for each pair of through holes, an upper through hole in an upper magnetic conductor plate of said pair of parallel magnetic conductor plates is aligned with a lower through hole in a lower magnetic conductor plate of said pair of parallel magnetic conductor plates;
a plurality of magnetic round rings in pairs, wherein for each pair of magnetic round rings, an upper magnetic round ring is inside said upper through hole of one pair of through holes and forms a first upper radial gap therebetween, a lower magnetic round ring is inside said lower through hole of said pair of through holes and forms a first lower radial gap therebetween, said upper magnetic round ring is aligned with said lower magnetic round ring, and a lower end of said upper magnetic round ring extends downward into said lower magnetic round ring and forms a magnetic-circuit gap therebetween;
a plurality of subsidiary coils between said upper and lower magnetic conductor plates, wherein said upper magnetic round ring of one pair of magnetic round rings is wound by one of said plurality of subsidiary coils,
thereby forming a plurality of magnetic sub-lens modules, wherein each of said plurality of magnetic sub-lens modules comprises one pair of through holes, one pair of magnetic round rings therein and one subsidiary coil winding said upper magnetic round ring of said pair of magnetic round rings, wherein for each magnetic sub-lens module, an optical axis thereof lies on a central axis of said upper magnetic round ring, said upper and lower magnetic round rings function as an upper pole-piece and a lower pole-piece respectively, and said subsidiary coil can be excited to provide a first magnetic flux leaking out through said magnetic-circuit gap and towards said optical axis; and
an annular permanent-magnet unit between said upper and lower magnetic conductor plates, surrounding said plurality of subsidiary coils and having an annular shape in a radial section, wherein said annular permanent-magnet unit is magnetized in a direction perpendicular to said upper magnetic conductor plate to provide a second magnetic flux to said plurality of magnetic sub-lens modules, wherein for each of said plurality of magnetic sub-lens modules, a portion of said second magnetic flux can flow in and leak out through said magnetic-circuit gap and towards said optical axis,
wherein each of said plurality of magnetic sub-lens modules therefore is able to form a magnetic round-lens field with an excitation of said subsidiary coil thereof and/or said annular permanent-magnetic unit, and consequently said multi-axis magnetic lens can provide a plurality of magnetic sub-lenses.

2. The multi-axis magnetic lens according to claim 1, wherein for said each pair of magnetic round rings, magnetic permeabilities of said upper and lower magnetic round rings are higher than that of said upper and lower magnetic conductor plates respectively.

3. The multi-axis magnetic lens according to claim 2, wherein said first upper and lower radial gaps can be vacuum or filled with non-magnetic or weakly-magnetic material.

4. The multi-axis magnetic lens according to claim 3, wherein said annular permanent-magnet unit contacts said upper and lower magnetic conductor plates.

5. The multi-axis magnetic lens according to claim 4, wherein said annular permanent-magnet unit can be formed by one full annular permanent magnet or several segmented permanent magnets.

6. The multi-axis magnetic lens according to claim 5, wherein outer radial dimensions of said upper and lower magnetic conductor plates are equal to or larger than that of said annular permanent-magnet unit.

7. The multi-axis magnetic lens according to claim 6, further comprising a magnetic-shielding tube which encloses said annular permanent-magnet unit with a third radial gap and keeps a fourth gap from one or each of said upper and lower magnetic conductor plates so as to reduce upper and lower stray magnetic fields respectively above and below said plurality of magnetic sub-lens modules.

8. The multi-axis magnetic lens according to claim 6, further comprising a magnetic short-circuit tube which is initially placed above said upper magnetic conductor plate or below said lower magnetic conductor plate so as not to influence said magnetic round-lens fields, and can be moved to connect peripheral portions of both said upper and lower magnetic conductor plates so as to form an enclosed magnetic bypass to said second magnetic flux and therefore turn off said multi-axis magnetic lens.

9. The multi-axis magnetic lens according to claim 6, further comprising a magnetic-shielding tube and a magnetic short-circuit tube, wherein said magnetic-shielding tube encloses said annular permanent-magnet unit with a third radial gap and keeps a fourth radial gap from one of said upper and lower magnetic conductor plates, and said magnetic short-circuit tube can be moved to fill in said fourth radial gap so as to form an enclosed magnetic bypass to said second magnetic flux and therefore turn off said multi-axis magnetic lens.

10. The multi-axis magnetic lens according to claim 6, further comprising a magnetic field-adjusting tube which encloses said annular permanent-magnet unit with a third radial gap and keeps a fifth axial gap from one of said upper and lower magnetic conductor plates, wherein said magnetic field-adjusting tube can be moved to change an axial size of said fifth axial gap so as to adjust said magnetic round-lens fields of said plurality of magnetic sub-lenses.

11. The multi-axis magnetic lens according to claim 6, further comprising an upper magnetic-shielding plate located above said upper magnetic conductor plate with a sixth axial gap and having a plurality of upper through circular openings each aligned with one of said plurality of magnetic sub-lens modules so as to reduce high order harmonics of magnetic fields of said plurality of magnetic sub-lenses.

12. The multi-axis magnetic lens according to claim 11, further comprising a lower magnetic-shielding plate located below said lower magnetic conductor plate with a seventh axial gap and having a plurality of lower through circular openings each aligned with one of said plurality of magnetic sub-lens modules so as to further reduce high order harmonics of magnetic fields of said plurality of magnetic sub-lenses.

13. The multi-axis magnetic lens according to claim 7, further comprising an upper magnetic-shielding plate located above said upper magnetic conductor plate with a sixth axial gap and having a plurality of upper through circular openings each aligned with one of said plurality of magnetic sub-lens modules, and a lower magnetic-shielding plate located below said lower magnetic conductor plate with a seventh axial gap and having a plurality of lower through circular openings each aligned with one of said plurality of magnetic sub-lens modules, thereby reducing high order harmonics of magnetic fields of said plurality of magnetic sub-lenses.

14. A multi-axis magnetic lens, comprising:
   a pair of parallel magnetic conductor plates with a plurality of through holes in pairs therein, wherein for each pair of through holes, an upper through hole in an upper magnetic conductor plate of said pair of parallel magnetic conductor plates is aligned with a lower through hole in a lower magnetic conductor plate of said pair of parallel magnetic conductor plates;
   a plurality of magnetic round rings, wherein each of said plurality of magnetic round rings has an upper end inside said upper through hole of one pair of through holes and forming a first radial gap therebetween, and a lower end inside said lower through hole and forming a magnetic-circuit gap therebetween;
   a plurality of subsidiary coils between said upper and lower magnetic conductor plates, wherein said each of said plurality of magnetic round rings is wound by one of said plurality of subsidiary coils,
   thereby forming a plurality of magnetic sub-lens modules, wherein each of said plurality of magnetic sub-lens modules comprises one pair of through holes, one magnetic round ring and one subsidiary coil winding said magnetic round ring, wherein for each magnetic sub-lens module, an optical axis lies on a central axis of said magnetic round ring, said magnetic round ring functions as an upper pole-piece and a peripheral portion of said lower through hole in said lower magnetic conductor plate functions as a lower pole-piece, and said subsidiary coil can be excited to provide a first magnetic flux leaking out through said magnetic-circuit gap and towards said optical axis; and
   an annular permanent-magnet unit between said upper and lower magnetic conductor plates, surrounding said plurality of subsidiary coils and having an annular shape in a radial section, wherein said annular permanent-magnet unit is magnetized in a direction perpendicular to said upper magnetic conductor plate to provide a second magnetic flux to said plurality of magnetic sub-lens modules, wherein for each of said plurality of magnetic sub-lens modules, a portion of said second magnetic flux can flow in and leak out through said magnetic-circuit gap and towards said optical axis,
   wherein each of said plurality of magnetic sub-lens modules therefore forms a magnetic round-lens field with an excitation of said subsidiary coil thereof and/or said annular permanent-magnetic unit, and consequently said multi-axis magnetic lens can provide a plurality of magnetic sub-lenses.

15. The multi-axis magnetic lens according to claim 14, wherein magnetic permeability of said each magnetic round ring is higher than that of both said upper and lower magnetic conductor plates.

16. The multi-axis magnetic lens according to claim 15, wherein said first radial gaps can be vacuum or filled with non-magnetic or weakly-magnetic material.

17. The multi-axis magnetic lens according to claim 16, wherein said annular permanent-magnet unit contacts said upper and lower magnetic conductor plates.

18. The multi-axis magnetic lens according to claim 17, wherein outer radial dimensions of said upper and lower magnetic conductor plates are equal to or larger than that of said annular permanent-magnet unit.

19. The multi-axis magnetic lens according to claim 18, further comprising a magnetic-shielding tube which encloses said annular permanent-magnet unit with a third radial gap and keeps a fourth gap from one or each of said upper and lower magnetic conductor plates so as to reduce a upper and lower stray magnetic fields respectively above and below said plurality of magnetic sub-lens modules.

20. The multi-axis magnetic lens according to claim 19, further comprising an upper magnetic-shielding plate located above said upper plate with a sixth axial gap and having a plurality of upper through circular openings each aligned with one of said plurality of magnetic sub-lens modules, and a lower magnetic-shielding plate located below said lower plate with a seventh axial gap and having a plurality of lower through circular openings each aligned with one of said plurality of magnetic sub-lens modules, thereby reducing high order harmonics of magnetic fields of said plurality of magnetic sub-lenses.

21. A method to configure a multi-axis magnetic lens, comprising:
   forming a plurality of magnetic sub-lens modules by a pair of parallel magnetic conductor plates with a plurality of through holes in pairs therein, a plurality of magnetic round rings in pairs and a plurality of subsidiary coils, wherein each of said plurality of magnetic sub-lens modules comprises one pair of through holes, one pair of magnetic round rings and one subsidiary coil,
   wherein for said pair of through holes, an upper through hole in an upper magnetic conductor plate of said pair of parallel magnetic conductor plates is aligned with a lower through hole in a lower magnetic conductor plate of said pair of parallel magnetic conductor plates,
   wherein for said pair of magnetic round rings, an upper magnetic round ring inside said upper through hole with a first upper radial gap is aligned with a lower magnetic round ring inside said lower through hole with a first lower radial gap, a lower end of said upper magnetic round ring extends downward into said lower magnetic round ring and forms a magnetic-circuit gap therebetween, magnetic permeabilities of said upper and lower magnetic round rings are higher than that of said upper and lower magnetic conductor plates respectively, and said first upper and lower radial gaps can be vacuum or filled with non-magnetic or weakly-magnetic material,
   wherein an optical axis of said magnetic sub-lens module lies on a central axis of said upper magnetic round ring,
   wherein said subsidiary coil is between said upper and lower magnetic conductor plates, winds around said upper magnetic ring and can be excited to provide a first magnetic flux leaking out through said magnetic-circuit gap and towards said optical axis; and
   placing an annular permanent-magnet unit between said upper and lower magnetic conductor plates and surrounding said plurality of subsidiary coils, wherein said annular permanent-magnet unit is magnetized in a direction perpendicular to said upper magnetic conductor plate to provide a second magnetic flux, and for said each magnetic sub-lens module, a portion of said second magnetic flux can flow in and leak out through said magnetic-circuit gap and towards said optical axis,
   wherein each of said plurality of magnetic sub-lens modules therefore is able to form a magnetic round-lens field with an excitation of said subsidiary coil and/or said annular permanent-magnetic unit.

22. The method according to claim 21, wherein said annular permanent-magnet unit contacts said upper and lower magnetic conductor plates.

23. The method according to claim 22, further placing a magnetic-shielding tube enclosing said annular permanent-magnet unit to reduce upper and lower stray magnetic fields respectively above and below said plurality of magnetic sub-lens modules.

24. A method to configure a multi-axis magnetic lens, comprising:
    forming a plurality of magnetic sub-lens modules by a pair of parallel magnetic conductor plates with a plurality of through holes in pairs therein, a plurality of magnetic round rings and a plurality of subsidiary coils, wherein each of said plurality of magnetic sub-lens modules comprises one pair of through holes, one magnetic round ring and one subsidiary coil,
        wherein for said pair of through holes, an upper through hole and a lower through hole are respectively in an upper magnetic conductor plate and a lower magnetic conductor plate of said pair of parallel magnetic conductor plates and aligned with each other, said magnetic round ring has an upper end inside said upper through hole with a first radial gap and a lower end inside said lower through hole and forming a magnetic-circuit gap therebetween, said magnetic round ring has permeability higher than that of said upper and lower magnetic conductor plates, and said first radial gap can be vacuum or filled with non-magnetic or weakly-magnetic material,
        wherein an optical axis of said magnetic sub-lens module lies on a central axis of said magnetic round ring,
        wherein said subsidiary coil is between said upper and lower magnetic conductor plates, winds around said magnetic round ring and can be excited to provide a first magnetic flux leaking out through said magnetic-circuit gap and towards said optical axis; and
    placing an annular permanent-magnet unit between said upper and lower magnetic conductor plates and surrounding said plurality of subsidiary coils, wherein said annular permanent-magnet unit is magnetized in a direction perpendicular to said upper magnetic conductor plate to provide a second magnetic flux, and for said each magnetic sub-lens module, a portion of said second magnetic flux can flow in and leak out through said magnetic-circuit gap and towards said optical axis,
    wherein each of said plurality of magnetic sub-lens modules therefore is able to form a magnetic round-lens field with an excitation of said subsidiary coil and/or said annular permanent-magnetic unit.

25. The method according to claim 24, wherein said annular permanent-magnet unit contacts said upper and lower magnetic conductor plates.

26. The method according to claim 25, further placing a magnetic-shielding tube enclosing said permanent-magnet unit to reduce upper and lower stray magnetic fields respectively above and below said plurality of magnetic sub-lens modules.

27. A method for forming a multi-axis magnetic lens with stable performance, comprising:
    providing a pair of parallel magnetic conductor plates with a plurality of through holes in pairs therein, wherein for each pair of through holes, an upper through hole and a lower through hole are respectively in an upper magnetic conductor plate and a lower magnetic conductor plate of said pair of parallel magnetic conductor plates and aligned with each other;
    providing a plurality of magnetic rings respectively inside said plurality of through holes, wherein each magnetic ring has an upper end inside said upper through hole of one pair of through holes with a first radial gap and a lower end inside said lower through hole of said pair of through holes and forming a magnetic-circuit gap therebetween, said magnetic ring has permeability higher than that of said upper and lower magnetic conductor plates, and said first radial gap can be vacuum or filled with non-magnetic or weakly-magnetic material;
    configuring a plurality of subsidiary coils, between said upper and lower magnetic conductor plates, respectively winding said plurality of magnetic rings; and
    providing an annular permanent-magnet unit between said upper and lower magnetic conductor plates and surrounding said plurality of subsidiary coils, wherein said annular permanent-magnet unit is magnetized in a direction perpendicular to said upper magnetic conductor plate.

28. A method for forming a multi-axis magnetic lens with stable performance, comprising:
    providing a pair of parallel magnetic conductor plates with a plurality of through holes in pairs therein, wherein for each pair of through holes, an upper through hole in an upper magnetic conductor plate of said pair of parallel magnetic conductor plates is aligned with a lower through hole in a lower magnetic conductor plate of said pair of parallel magnetic conductor plates;
    providing a plurality of magnetic rings in pairs respectively inside said plurality of through holes in pairs, wherein for each pair of magnetic rings, an upper magnetic ring inside said upper through hole of one pair of through holes with a first upper radial gap is aligned with a lower magnetic ring inside said lower through hole of said pair of through holes with a first lower radial, a lower end of said upper magnetic ring extends downward into said lower magnetic ring and forms a magnetic-circuit gap therebetween, magnetic permeabilities of said upper and lower magnetic rings are higher than that of said upper and lower magnetic conductor plates respectively, and said first upper and lower radial gaps can be vacuum or filled with non-magnetic or weakly-magnetic material;
    configuring a plurality of subsidiary coils, between said upper and lower magnetic conductor plates, respectively winding said plurality of upper magnetic rings; and
    providing an annular permanent-magnet unit between said upper and lower magnetic conductor plates and surrounding said plurality of subsidiary coils, wherein said annular permanent-magnet unit is magnetized in a direction perpendicular to said upper magnetic conductor plate.

* * * * *